(12) United States Patent
Ning

(10) Patent No.: US 11,854,640 B2
(45) Date of Patent: Dec. 26, 2023

(54) MEMORY DEVICE, TESTING METHOD AND USING METHOD THEREOF, AND MEMORY SYSTEM

(71) Applicant: CHANGXIN MEMORY TECHNOLOGIES, INC., Hefei (CN)

(72) Inventor: Shu-Liang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 149 days.

(21) Appl. No.: 17/446,143

(22) Filed: Aug. 26, 2021

(65) Prior Publication Data

US 2022/0084619 A1 Mar. 17, 2022

Related U.S. Application Data

(63) Continuation of application No. PCT/CN2021/099238, filed on Jun. 9, 2021.

(30) Foreign Application Priority Data

Sep. 15, 2020 (CN) .......................... 202010966642.2

(51) Int. Cl.
*G11C 29/42* (2006.01)
*G11C 29/44* (2006.01)
(Continued)

(52) U.S. Cl.
CPC .............. *G11C 29/42* (2013.01); *G11C 29/10* (2013.01); *G11C 29/12015* (2013.01);
(Continued)

(58) Field of Classification Search
CPC .............. G11C 29/42; G11C 29/12015; G11C 29/4401; G11C 29/76; G11C 29/789
See application file for complete search history.

(56) References Cited

U.S. PATENT DOCUMENTS 9,508,456 B1  11/2016  Shim
9,747,998 B2 * 8/2017  Kim ...................... G11C 29/44
(Continued)

FOREIGN PATENT DOCUMENTS

CN    103295648 A    9/2013
CN    103733260 A    4/2014
(Continued)

OTHER PUBLICATIONS

Supplementary European Search Report in the European application No. 21868167.4, dated Nov. 8, 2022.
(Continued)

*Primary Examiner* — Tuan T Nguyen
(74) *Attorney, Agent, or Firm* — SYNCODA LLC; Feng Ma

(57) ABSTRACT

A memory device includes: a plurality of channels, each including a memory cell array, the memory cell array including a normal cell array, the normal cell array including normal memory cells, and each of the normal memory cells being a volatile memory cell; a testing control circuit, configured to control testing of the normal cell array in the plurality of channels in response to a testing instruction, and to determine an access address of a normal memory cell failing the testing in the normal cell array in the plurality of channels to be a failure address; and a non-volatile memory cell array which includes a plurality of non-volatile memory cells and is configured to receive and store the failure address from the testing control circuit.

19 Claims, 21 Drawing Sheets

(51) Int. Cl.
  *G11C 29/00* (2006.01)
  *G11C 29/12* (2006.01)
  *G11C 29/10* (2006.01)

(52) U.S. Cl.
  CPC .......... *G11C 29/4401* (2013.01); *G11C 29/76* (2013.01); *G11C 29/789* (2013.01)

(56) References Cited

U.S. PATENT DOCUMENTS

| | | | |
|---|---|---|---|
| 9,837,890 B2* | 12/2017 | Watanabe | ............... H02M 3/07 |
| 10,600,496 B1 | 3/2020 | Wieduwilt | |
| 2003/0107926 A1 | 6/2003 | Ohmura | |
| 2007/0108991 A1* | 5/2007 | Ball | .................... G01R 31/275 |
| | | | 324/537 |
| 2008/0310230 A1* | 12/2008 | Kim | ................... G11C 16/3418 |
| | | | 365/185.11 |
| 2010/0131812 A1 | 5/2010 | Mohammad | |
| 2013/0028009 A1 | 1/2013 | Kim | |
| 2014/0324375 A1* | 10/2014 | Seo | .................... G01C 19/5726 |
| | | | 702/141 |
| 2015/0287480 A1 | 10/2015 | Wilson et al. | |
| 2016/0232987 A1 | 8/2016 | Wilson et al. | |
| 2016/0372214 A1 | 12/2016 | Shim | |
| 2017/0098480 A1 | 4/2017 | Wilson et al. | |
| 2017/0110206 A1* | 4/2017 | Ryu | .................... G11C 29/4401 |
| 2017/0125119 A1* | 5/2017 | Loh | .................... G11C 29/1201 |
| 2018/0005710 A1 | 1/2018 | Wilson et al. | |
| 2019/0156909 A1 | 5/2019 | Lee et al. | |
| 2020/0211671 A1 | 7/2020 | Lee et al. | |
| 2020/0265912 A1 | 8/2020 | Wieduwilt et al. | |
| 2021/0335443 A1 | 10/2021 | Wieduwilt et al. | |

FOREIGN PATENT DOCUMENTS

| | | |
|---|---|---|
| CN | 110021333 A | 7/2019 |
| CN | 212675921 U | 3/2021 |

OTHER PUBLICATIONS

International Search Report in the international application No. PCT/CN2021/099238, dated Sep. 8, 2021.

* cited by examiner

MEMORY DEVICE, TESTING METHOD AND USING METHOD THEREOF, AND MEMORY SYSTEM

CROSS-REFERENCE TO RELATED APPLICATIONS

This application is a continuation of International Application No. PCT/CN2021/099238 filed on Jun. 9, 2021, which claims priority to Chinese Patent Application No. 202010966642.2 filed on Sep. 15, 2020. The disclosures of these applications are hereby incorporated by reference in their entirety.

BACKGROUND

Since a volatile memory has relatively fast read and write speed, it is widely applied to various electronic apparatuses. As the integration level is increased, one volatile memory chip includes more and more normal memory cells. If one of the normal memory cells is unavailable, or even the whole row or the whole column of the normal memory cells cannot be used, the whole chip may be unavailable, which seriously reduces the yield of the chip.

It is to be noted that the information disclosed in the above background section is only used to enhance an understanding of the background of the disclosure, and thus may include the information that does not constitute the conventional art known to those of ordinary skill in the art.

SUMMARY

The disclosure relates generally to the technical field of semiconductors, and more specifically to a memory device, a memory system, a method of testing a memory device, and a method of using a memory device.

Various embodiments of disclosure provide a memory device, a memory system, a method for testing the memory device, and a method for using the memory device.

According to one aspect of the disclosure, a memory device is provided. The memory device includes: a plurality of channels, each channel comprising a memory cell array, the memory cell array comprising a normal cell array, the normal cell array comprising normal memory cells, and each of the normal memory cells being a volatile memory cell; a testing control circuit, configured to control testing of the normal cell array in each of the plurality of channels in response to a testing instruction and to determine an access address of a normal memory cell failing the testing in the normal cell array in each of the plurality of channels to be a failure address; and a non-volatile memory cell array, configured to receive and store the failure address from the testing control circuit.

According to one aspect of the disclosure, a memory system is provided. The memory system includes: at least one memory layer; and a memory controller which is configured to control the at least one memory layer. Each of the at least one memory layer includes: a plurality of channels, each including a memory cell array, the memory cell array including a normal cell array, the normal cell array including a plurality of normal memory cells, and each of the normal memory cells being a volatile memory cell; a testing control circuit, configured to control testing of the normal cell array in each of the plurality of channels in response to a testing instruction and to determine an access address of a normal memory cell failing the testing in the normal cell array in each of the plurality of channels to be a failure address; and a non-volatile memory cell array which includes a plurality of non-volatile memory cells and is configured to receive and store the failure address from the testing control circuit.

According to one aspect of the disclosure, a method for testing a memory device is provided. The memory device includes: a plurality of channels and a non-volatile memory cell array, each of the channels comprises a memory cell array, the memory cell array comprises a normal cell array, the normal cell array comprises normal memory cells, each of the normal memory cell is a volatile memory cell, and the non-volatile memory cell array comprises a plurality of non-volatile memory cells. The testing method includes that: a testing instruction is received; testing of the normal cell array in the plurality of channels is controlled according to the testing instruction, and an access address of a normal memory cell which fails the testing in the normal cell array in the plurality of channels is determined to be a failure address; and the failure address is sent and stored to the non-volatile memory cell array.

According to one aspect of the disclosure, a method for using a memory device is provided. The memory device includes a plurality of channels and a non-volatile memory cell array. Each of the channels comprises a memory cell array and a latch block, the memory cell array comprises a normal cell array, the normal cell array comprises normal memory cells, each of the normal memory cells is a volatile memory cell, the non-volatile memory cell array comprises a plurality of non-volatile memory cells, and the non-volatile memory cell array is configured to store a failure address indicating an access address of a normal memory cell failing the testing in the normal cell array in the plurality of channels. The method includes that: responsive to the memory device being powered on, the failure address in the non-volatile memory cell array is transferred to a latch block of the channel corresponding to the failure address.

It will be appreciated that both the foregoing general description and the following detailed description are exemplary and explanatory only and cannot limit the disclosure.

BRIEF DESCRIPTION OF THE DRAWINGS

The accompanying drawings which are incorporated in and constitute a part of the specification, illustrate embodiments consistent with the disclosure and, together with the specification, serve to explain the principle of the disclosure. Apparently, for those skilled in the art, the drawings in the following description are only some embodiments of the disclosure, and other drawings may also be obtained from these drawings without involving any inventive effort.

DETAILED DESCRIPTION

Figure 1:
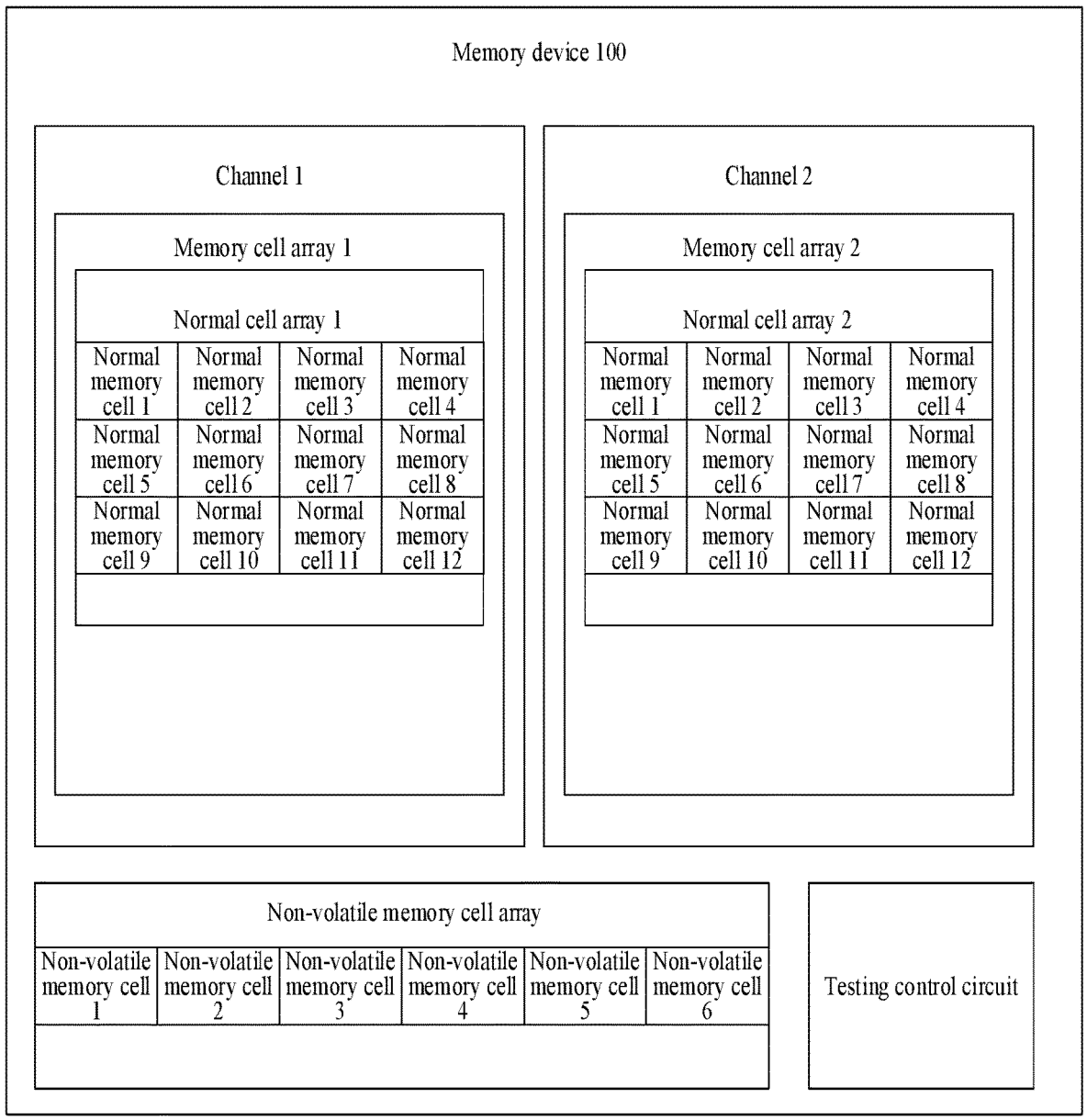
FIG. 1 schematically shows a schematic diagram of a memory device according to an embodiment of the disclosure.

Exemplary implementation modes will now be described more comprehensively with reference to the accompanying drawings. However, the exemplary implementation modes can be implemented in various forms and should not be construed as limited by the examples set forth herein; rather, these implementation modes are provided so that the disclosure will be thorough and complete, and will fully convey the concept of the exemplary implementation modes to those skilled in the art.

In addition, the described features, structures, or characteristics may be combined in one or more embodiments in any suitable mode. In the following description, a number of specific details are provided in order to provide a thorough understanding of the embodiments of the disclosure. However, it will be appreciated by those skilled in the art that the technical solution of the disclosure may be practiced without one or more of the specific details, or with other methods, elements, devices, steps, and the like. In other cases, well-known methods, devices, implementations, or operations are not shown or described in detail to avoid obscuring each aspect of the disclosure.

The block diagrams shown in the drawings are merely function entities and do not necessarily have to correspond to physically independent entities. That is, the function entities may be implemented in the form of software, or in at least one hardware module or integrated circuit, or in different networks and/or processor devices and/or microcontroller devices.

The flow charts shown in the drawings are merely exemplary descriptions, do not necessarily include all the content and operations/steps, and are not necessarily performed in the described order. For example, some operations/steps may also be broken down, while some operations/steps may be merged or partially merged, so that the order of actual execution may vary depending on the actual situation.

Although relative terms such as "upper" and "lower" are used in the specification to describe a relative relationship of one assembly of the reference numeral to another assembly, these terms are used in the specification for convenience only, for example, according to an orientation of the example illustrated in the drawings. It will be appreciated that if a device of the reference numeral is turned upside down, the "upper" component described above will become the "lower" component. When a structure is "on" another structure, it may mean that the structure is integrally formed with the other structure, or that the structure is "directly" disposed on the other structure, or that the structure is "indirectly" disposed on the other structure through the other structure.

The terms "a", "an", "the", "the", and "at least one" are used to indicate the presence of one or more elements/constituent parts/and the like. The terms "including" and "having" are used in an open inclusive sense and mean that there may be additional elements/constituent parts/and the like in addition to the listed elements/constituent parts/and the like. The terms "first" and "second", and the like are used only as labels and are not intended to limit the number of objects.

Spare memory cells are usually provided in the volatile memory chip in addition to the normal memory cells to replace the above unavailable normal memory cell(s). That is, the normal memory cell refers to a memory cell which is preferentially used for data reading and writing when the test is successful, and the spare memory cell refers to a memory cell which is used to replace the unavailable normal memory cell when one or some memory cells are unavailable.

Meanwhile, with a demand for high bandwidth, more and more memory devices will be integrated with a plurality of channels. Various embodiments of the present disclosure can address a problem of how to reasonably replace the unavailable normal memory cell with the spare memory cell in such a high bandwidth application scenario.

FIG. 1 schematically shows a schematic diagram of a memory device according to an embodiment of the disclosure. As shown in FIG. 1, a memory device 100 provided by the embodiment of the disclosure may include a plurality of channels, a testing control circuit, and a non-volatile memory cell array.

In the embodiment of FIG. 1, a memory device 100 including a channel 1 and a channel 2 is taken as an example, but the disclosure does not limit the number of the channels, as long as the number of the channels is greater than or equal to 2.

Each channel may include a memory cell array, each memory cell array may include a normal cell array, each normal cell array may include a normal memory cell, and each normal memory cell may be a volatile memory cell. The volatile memory cell refers to a memory cell in which stored data may be lost after the memory cell is powered off.

For example, in FIG. 1, the channel 1 may include the memory cell array 1, the memory cell array 1 may include the normal cell array 1, and the normal cell array 1 may include the normal memory cell 1 to the normal memory cell 12. Similarly, the channel 2 may include the memory cell array 2, the memory cell array 2 may include the normal cell array 2, and the memory cell array 2 may further include the normal memory cell 1 to the normal memory cell 12.

It is to be noted that the fact that each normal cell array includes 12 normal memory cells shown in FIG. 1 is taken as an example only, in fact, the number of the normal memory cells included in each normal cell array may be designed according to a practical requirement, and the disclosure does not limit this. These normal cell arrays may be composed of a plurality of memory banks, and the normal memory cell in the normal cell array may be connected to different word lines and bit lines.

In the embodiment of the disclosure, the testing control circuit may be configured to control testing of the normal cell array in the plurality of channels of the memory device 100 in response to a testing instruction and to determine an access address of the normal memory cell which fails the testing in the normal cell array in the plurality of channels as a failure address.

It is be noted that each failure address in the embodiment of the disclosure may be one or any combination of a row address, a column address, a memory bank address, and the like of a single normal memory cell. The disclosure does not limit this, and a meaning to which a failure address refers may be determined as required.

In the embodiment of the disclosure, the non-volatile memory cell array may include a plurality of non-volatile memory cells. The non-volatile memory cell refers to a memory cell in which stored data is not lost in case that the memory cell is powered off. The non-volatile memory cell array may be configured to receive and store the failure address from the testing control circuit.

For example, in FIG. 1, it is assumed that the non-volatile memory cell array includes the non-volatile memory cell 1 to the non-volatile memory cell 5, but the number of the non-volatile memory cells herein is taken as an example only, in fact, the non-volatile memory cell included in the non-volatile memory cell array may be designed according to a practical requirement, and the disclosure does not limit this.

In the embodiment of the disclosure, the non-volatile memory cell may be implemented in any of various different forms. For example, the non-volatile memory cell may be implemented by using a fuse, an efuse, an anti-fuse, a Magnetoresistive Random Access Memory (MRAM), a Ferroelectric RAM (FeRAM), a flash, and the like.

According to the memory device provided by the embodiment of the disclosure, on one hand, the memory device including a plurality of channels share the same non-volatile memory cell array, so that a high bandwidth requirement may be met; and on the other hand, the non-volatile memory cell in the non-volatile memory cell array is used to store the failure address corresponding to the access address of the unavailable normal memory cell which fails the testing in the normal cell array in the plurality of channels, so that after the memory cell array in the plurality of channels is powered off, it can still be learned which normal memory cell(s) of the memory cell array in the plurality of channels is/are unavailable. In this way, after the memory device is powered on next time, retesting is not needed, so that the testing time and cost are reduced, the testing efficiency is improved, and meanwhile, the high-speed read and write performance of the volatile memory cell adopted by the memory cell array in each channel may be maintained.

Figure 2:
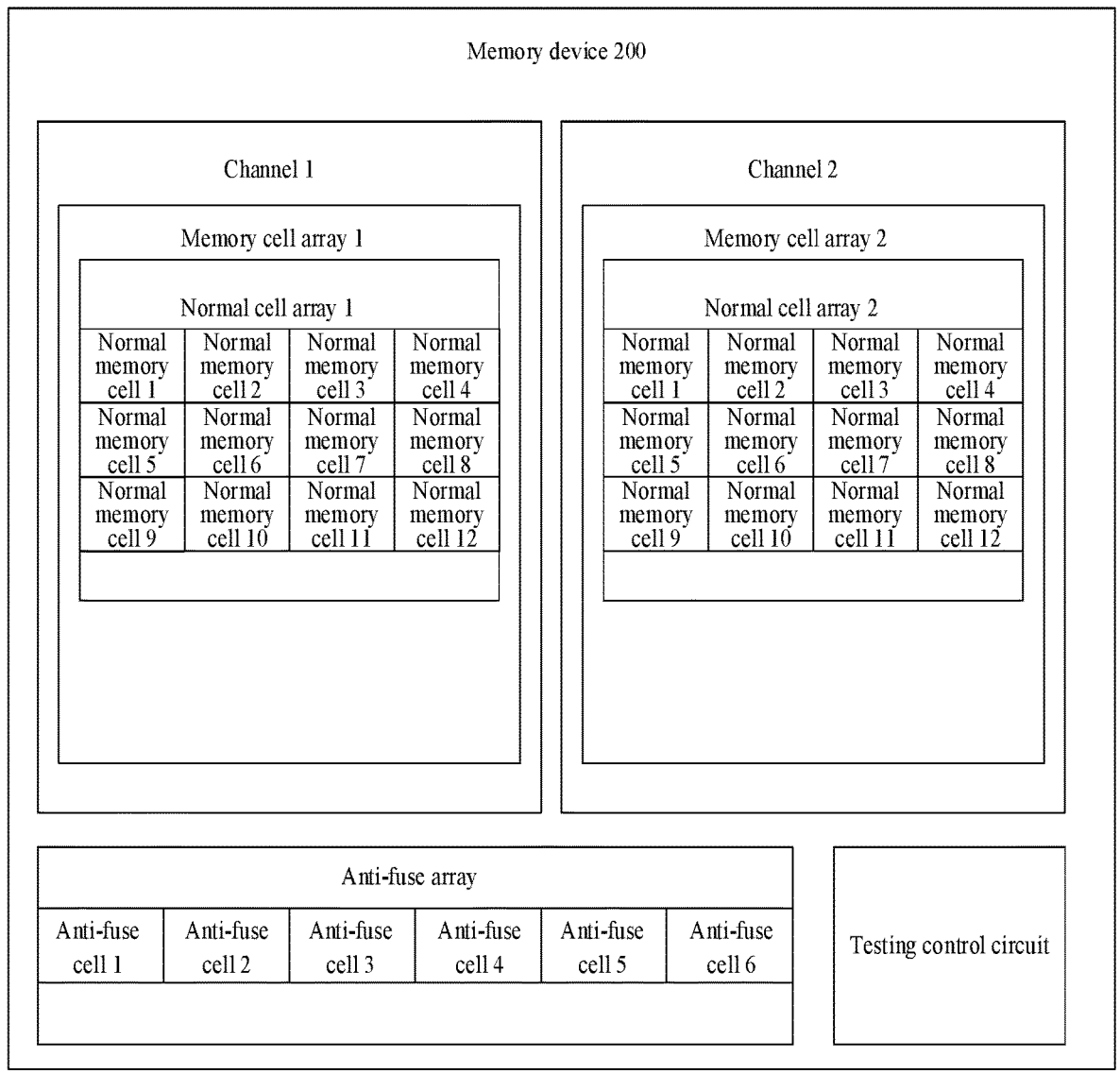
FIG. 2 schematically shows a schematic diagram of a memory device according to an embodiment of the disclosure.

FIG. 2 schematically shows a schematic diagram of a memory device according to an embodiment of the disclosure. The difference between a memory device 200 provided by the embodiment in FIG. 2 and the above memory device 100 provided by the embodiment in FIG. 1 lies in that, in the embodiment in FIG. 2, the non-volatile memory cell array may include an anti-fuse array and correspondingly, the non-volatile memory cell may be an anti-fuse cell.

For example, the anti-fuse cell 1 in FIG. 2 may correspond to the non-volatile memory cell 1 in FIG. 1, the anti-fuse cell 2 may correspond to the non-volatile memory cell 2 in FIG. 1, the anti-fuse cell 3 may correspond to the non-volatile memory cell 3 in FIG. 1, the anti-fuse cell 4 may correspond to the non-volatile memory cell 4 in FIG. 1, and the anti-fuse cell 5 may correspond to the non-volatile memory cell 5 in FIG. 1.

In the following example, the fact that the non-volatile memory cell array is the anti-fuse array is taken as an example, but the disclosure is not limited herein, and the non-volatile memory cell in the non-volatile memory cell array may also be implemented by arranging any other cells having a non-volatile memory function.

Figure 3:
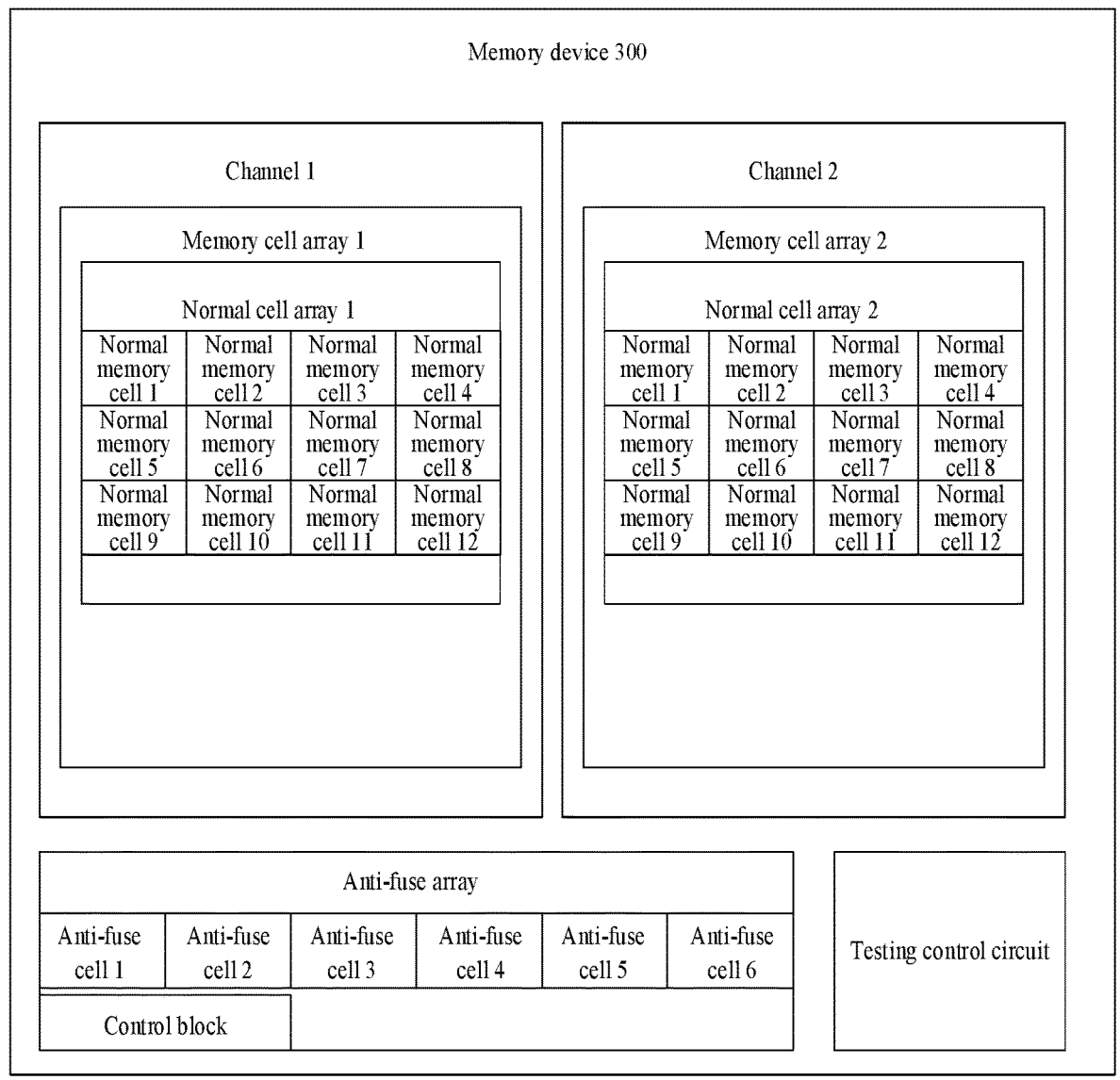
FIG. 3 schematically shows a schematic diagram of a memory device according to an embodiment of the disclosure.

FIG. 3 schematically shows a schematic diagram of a memory device according to an embodiment of the disclosure.

The difference between a memory device 300 provided by the embodiment in FIG. 3 and the above memory device 200 provided by the embodiment in FIG. 2 is that in the memory device 300, the anti-fuse may further include a control block. The control block may be configured to control programming of the anti-fuse array, and the failure address received from the testing control circuit is stored in the anti-fuse cell in the anti-fuse array.

According to the memory device provided by the implementation mode of the disclosure, the anti-fuse array is adopted as the non-volatile memory cell array, and the anti-fuse cell in the anti-fuse array is used as the non-volatile memory cell to store the failure address in the normal cell array. Since the anti-fuse cell is relatively small, the anti-fuse cell has a relatively small footprint area, can be implemented easily, is radiation-resistant and interference-resistant, and is not influenced by electromagnetic radiation.

Figure 4:
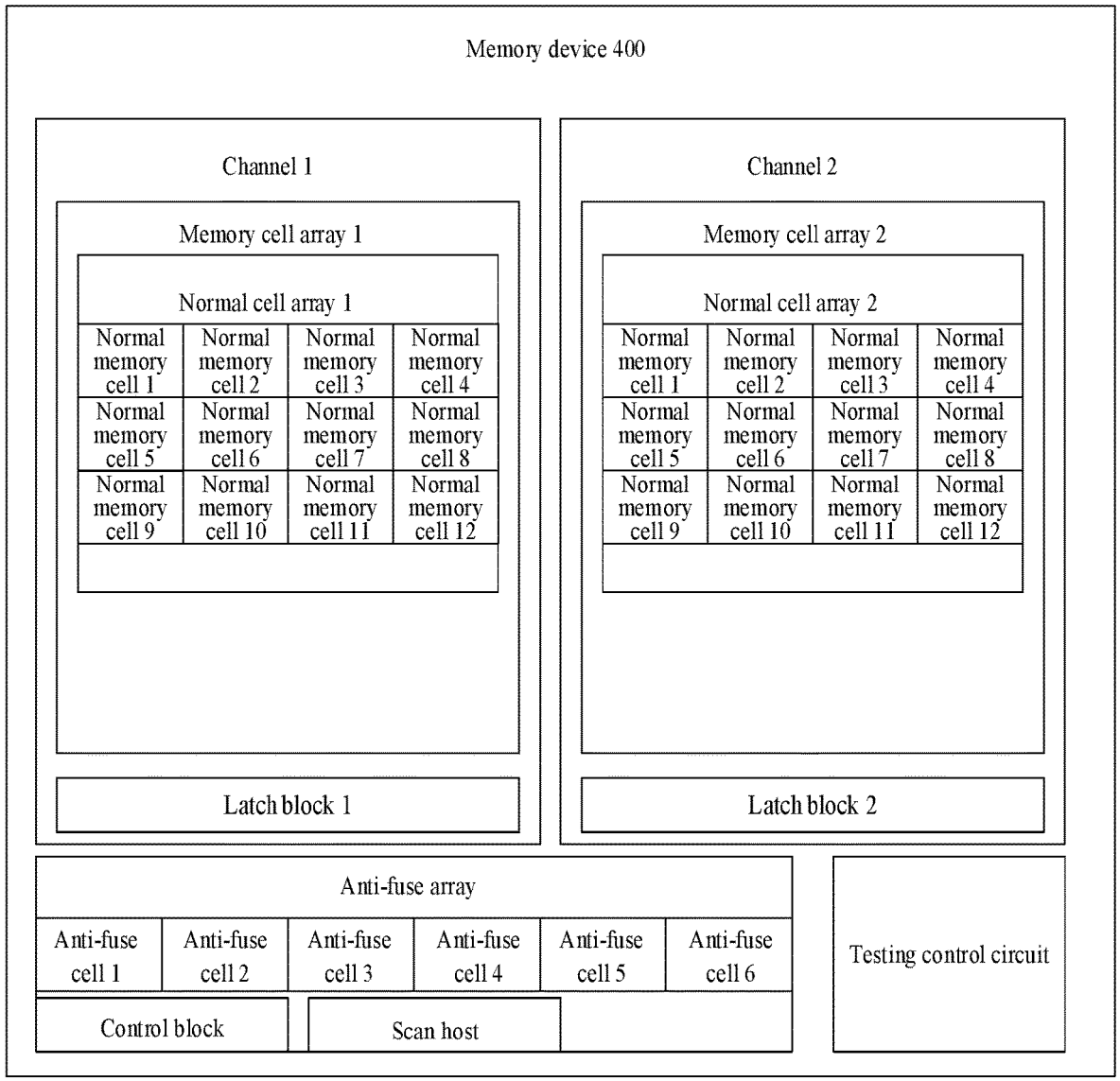
FIG. 4 schematically shows a schematic diagram of a memory device according to an embodiment of the disclosure.

FIG. 4 schematically shows a schematic diagram of a memory device according to an embodiment of the disclosure. The difference between a memory device 400 provided by the embodiment in FIG. 4 and the above memory device 300 provided by the embodiment in FIG. 3 is that each channel may further include a latch block.

For example, in FIG. 4, the channel 1 may further include the latch block 1 and the channel 2 may further include the latch block 2.

In the embodiment of FIG. 4, the anti-fuse array may further include a scan host. The scan host may be configured to transfer the failure address stored in the anti-fuse array to the latch block of the corresponding channel when the memory device 400 is powered on.

For example, in FIG. 4, when the memory device 400 is powered on, the failure address stored in the anti-fuse array may be transferred to the latch block 1 of the channel 1 and/or the latch block 2 of the channel 2.

According to the memory device provided by the implementation mode of the disclosure, to ensure the relatively fast read and write speed, each normal memory cell in the normal cell array in the memory cell array of each channel is the volatile memory cell. Since each memory cell array includes many normal memory cells, to improve the yield of a chip, the normal cell array in the memory cell array of each channel needs to be tested before delivery to obtain the failure address. Meanwhile, to prevent the data from being lost after the memory device is powered off, these failure addresses need to be stored to the non-volatile memory cell array (for example, the anti-fuse array) which adopts the non-volatile memory cell. However, when the memory device is used and fast reading and writing are performed on the normal memory cell in the normal cell array, it is also necessary to quickly acquire the normal memory cell(s) that are unavailable, and if the failure address is read from the non-volatile memory cell array during fast reading and writing, the required failure address cannot be acquired timely because the data read speed of the non-volatile memory cell is slower than that of the volatile memory cell. To further solve this problem, in the embodiment of the disclosure, when the memory device is powered on, the failure address stored in the non-volatile memory cell array is transferred to the latch block of the corresponding channel, so that the unavailable normal memory cell may be replaced fast or is not used in a read and write process of the memory device.

Figure 5:
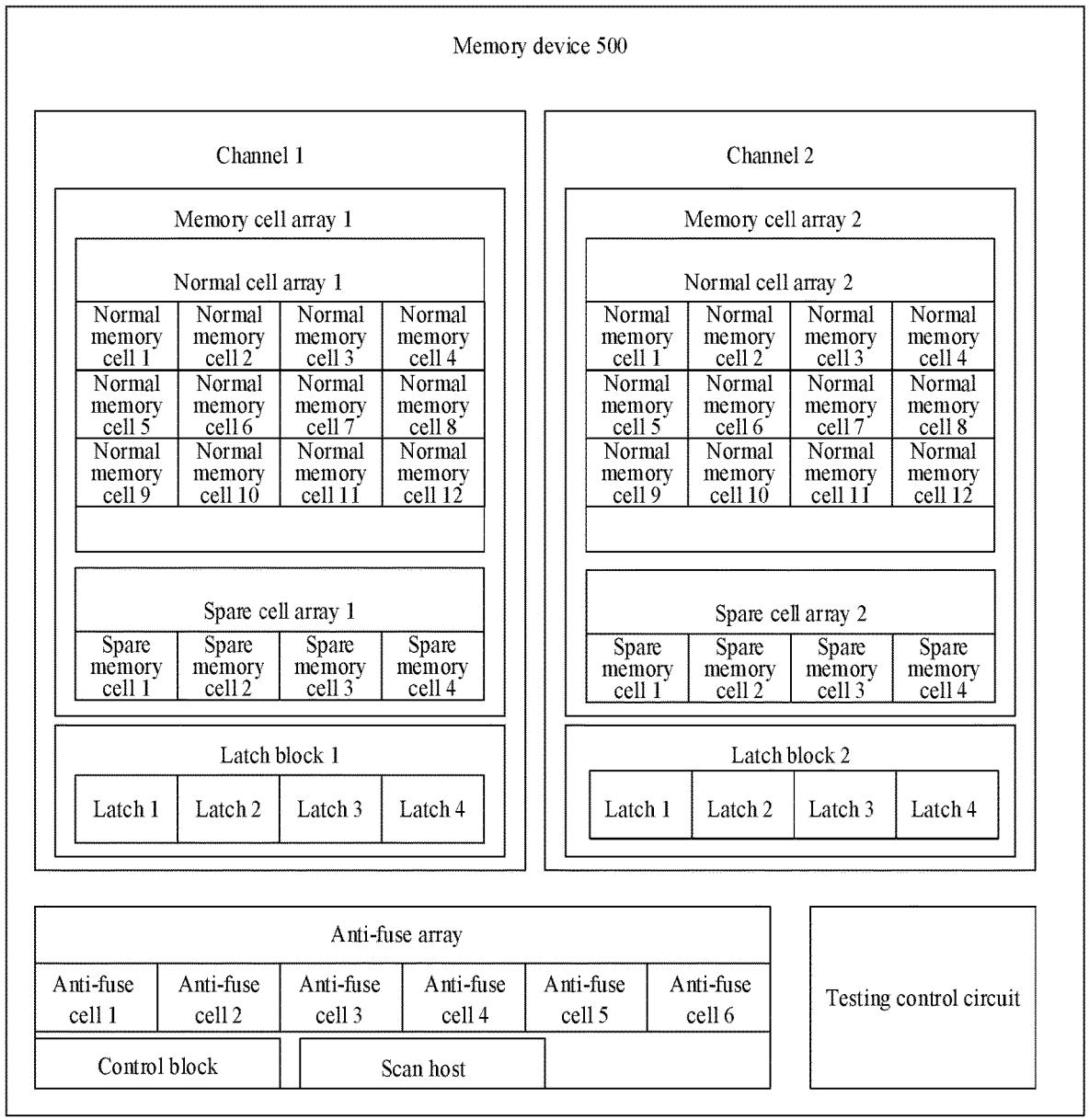
FIG. 5 schematically shows a schematic diagram of a memory device according to an embodiment of the disclosure.

FIG. 5 schematically shows a schematic diagram of a memory device according to an embodiment of the disclosure.

The difference between the memory device 500 provided by the embodiment in FIG. 5 and the above memory device 400 provided by the embodiment in FIG. 4 lies in that, in the memory device 500, each latch block may include a first number of latches, each memory cell array may further include a spare cell array(s), each spare cell array may include the first number of spare memory cells, and each spare memory cell is a volatile memory cell.

In other embodiments, the latch block may also be replaced with a register block, that is, a register in the register block is adopted to implement the function of the latch.

It is to be noted that each spare memory cell in the embodiment of the disclosure may include one volatile memory cell (the corresponding failure address is an access address of a single normal memory cell), and may further include a row of volatile memory cells (the corresponding failure address is a row address) on a word line, or a column of volatile memory cells (the corresponding failure address is a column address) on a bit line, or the volatile memory cell (the corresponding failure address is a memory bank address) of one memory bank, and the like. Those skilled in the art may choose by themselves according to a requirement.

For example, in FIG. 5, the memory cell array 1 in the channel 1 may include the normal cell array 1 and the spare cell array 1, and the spare cell array 1 may include four (that is, it is assumed that the first number is equal to 4, but this is an example only, and the disclosure is not limited herein) spare memory cells, for example, the spare memory cell 1 to the spare memory cell 4. Correspondingly, the latch block 1 may include four latches, for example, the latch 1 to the latch 4. It is be noted that one latch in the embodiment represents a latch capable of storing one failure address.

Similarly, the memory cell array 2 in the channel 2 may include the normal cell array 2 and the spare cell array 2, and the spare cell array 2 may include four spare memory cells, for example, the spare memory cell 1 to the spare memory cell 4. Correspondingly, the latch block 2 may include four latches, for example, the latch 1 to the latch 4.

In the embodiment of the disclosure, in each channel, each latch in the latch block may be arranged to correspond to a respective one of the spare memory cells in the spare cell array.

For example, in the embodiment of FIG. 5, the latch 1 in the latch block 1 in the channel 1 corresponds to the spare memory cell 1 in the spare cell array 1 in the channel 1, the latch 2 in the latch block 1 in the channel 1 corresponds to the spare memory cell 2 in the spare cell array 1 in the channel 1, the latch 3 in the latch block 1 in the channel 1 corresponds to the spare memory cell 3 in the spare cell array 1 in the channel 1, and the latch 4 in the latch block 1 in the channel 1 corresponds to the spare memory cell 4 in the spare cell array 1 in the channel 1.

The latch 1 in the latch block 2 in the channel 2 corresponds to the spare memory cell 1 in the spare cell array 2 in the channel 2, the latch 2 in the latch block 2 in the channel 2 corresponds to the spare memory cell 2 in the spare cell array 2 in the channel 2, the latch 3 in the latch block 2 in the channel 2 corresponds to the spare memory cell 3 in the spare cell array 2 in the channel 2, and the latch 4 in the latch block 2 in the channel 2 corresponds to the spare memory cell 4 in the spare cell array 2 in the channel 2.

In the embodiment of the disclosure, the scan host in the anti-fuse array is configured to, when the memory device 500 is powered on, transfer the failure address in the anti-fuse array to the corresponding latch in the latch block of the corresponding channel, so as to determine an access address of a target spare memory cell configured to replace the failure address as a repair address.

For example, in FIG. 5, it is assumed that during testing, the normal memory cell 1 to the normal memory cell 4 in a first row of the normal cell array 1 in the memory cell array 1 in the channel 1 are found to fail the testing, the access addresses of the normal memory cell 1 to the normal memory cell 4 in the first row of the normal cell array 1 in the memory cell array 1 in the channel 1 are taken as one failure address, and the failure address is stored to an anti-fuse cell 1 in the anti-fuse array. Then, when the memory device 500 is powered on, the scan host may transfer the failure address of the normal memory cell 1 to the normal memory cell 4 in the first row of the normal cell array 1 in the memory cell array 1 in the channel 1 stored in the anti-fuse cell 1 to the latch 1 in the latch block 1 of the channel 1, then the spare memory cell 1 in the spare cell array 1 corresponding to the latch 1 in the latch block 1 is determined to be used as the target spare memory cell, and the access address of the spare memory cell 1 in the spare cell array 1 is used as the repair address to replace the failure address of the normal memory cell 1 to the normal memory cell 4 of the first row of the normal cell array 1 in the memory cell array 1 in the channel 1.

It is to be noted that in the above example, the premise is that the normal memory cell represents a single memory cell and the spare memory cell represents a plurality of memory cells, the embodiment does not impose a limitation on this, and the above description is only intended to illustrate a redundant replacement procedure of the embodiment for the normal memory cell which fails the testing.

For another example, it is assumed that during testing, the normal memory cell 1, the normal memory cell 5, and the normal memory cell 9 in a first column of the normal cell array 1 in the memory cell array 1 in the channel 1 are found to fail the testing, the access addresses of the normal memory cell 1, the normal memory cell 5, and the normal memory cell 9 of the first column of the normal cell array 1 in the memory cell array 1 in the channel 1 are taken as one failure address, and the failure address is stored to an anti-fuse cell 2 in the anti-fuse array. Then, when the memory device 500 is powered on, the scan host may transfer the failure address of the normal memory cell 1, the normal memory cell 5, and the normal memory cell 9 of the first column of the normal cell array 1 in the memory cell array 1 in the channel 1 stored in the anti-fuse cell 2 to the latch 2 in the latch block 1 of the channel 1, then the spare memory cell 2 in the spare cell array 1 corresponding to the latch 2 in the latch block 1 is determined to be used as the target spare memory cell, and the access address of the spare memory cell 2 in the spare cell array 1 is used as the repair address to replace the failure addresses of the normal memory cell 1, the normal memory cell 5, and the normal memory cell 9 in the first column of the normal cell array 1 in the memory cell array 1 in the channel 1.

In an exemplary embodiment, each normal cell array may include a second number of normal memory cells, and the second number may be greater than or equal to the first number.

For example, in FIG. 5, it is assumed that the normal cell array 1 in the channel 1 includes 12 (that is, it is assumed that the second number is equal to 12, but the disclosure is not limited herein) normal memory cells, and the spare cell array 1 in the channel 1 includes 4 spare memory cells, that is, generally, the number of the spare memory cells in the same channel is arranged to be smaller than the number of the normal memory cells.

It is to be noted that, in the embodiment of the disclosure, in each channel, each latch in the latch block is arranged to correspond to a respective one of spare memory cells in the spare cell array, it is not strictly required that each spare memory cell and the corresponding latch have a same serial number, instead, the requirement is met as long as for each latch, there is a respective spare memory cell. For example, in the above example of FIG. 5, the spare memory cell 1 in the spare cell array 1 may also be arranged to correspond to the latch 2 in the latch block 1.

According to the memory device provided by the implementation mode of the disclosure, in order to solve the problem that the unavailable normal memory cell is detected in a testing phase in the normal cell array in the memory cell array in each channel, some redundant spare memory cells may be arranged in each channel to replace those unavailable normal memory cells. However, in order to prevent power-off loss, the non-volatile memory cell needs to remember the normal memory cell(s) that is/are unavailable and to designate spare memory cell(s) for replacement, the spare memory cell(s) designated for replacement is/are called the target spare memory cell(s), and the access address of the target spare memory cell is called the repair address. When the failure address stored in the non-volatile memory cell array is transferred to the latch block of the corresponding channel, according to the embodiment of the disclosure, in each channel, each latch in the latch block is arranged to correspond to a respective one of spare memory cells in the spare cell array. In this way, after the latch to which the failure address is stored is determined, which spare memory cell is adopted as the target spare memory cell for replacing the normal memory cell corresponding to the failure address may be determined, thereby reducing the memory capacity of the latched block.

In other embodiments, the failure address and the repair address thereof stored in the non-volatile memory cell array may also be simultaneously transferred to the latch(es) in the latch block of the corresponding channel, and at this time, the number of the latch(es) may be greater than the number of the spare memory cells in the corresponding channel.

Figure 6:
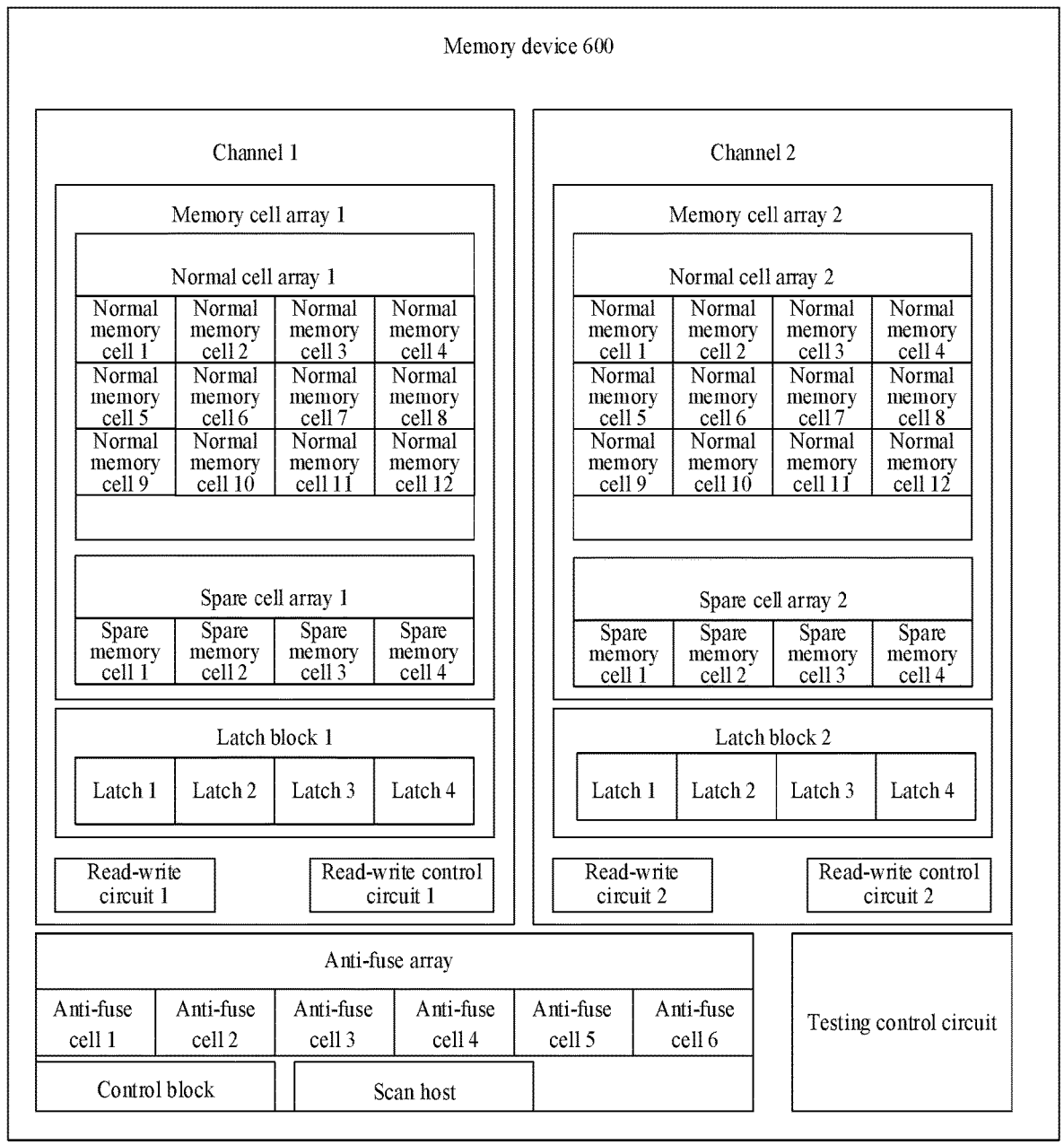
FIG. 6 schematically shows a schematic diagram of a memory device according to an embodiment of the disclosure.

FIG. 6 schematically shows a schematic diagram of a memory device according to an embodiment of the disclosure. The difference between a memory device 600 provided by the embodiment in FIG. 6 and the above memory device 500 provided by the embodiment in FIG. 5 lies in that, in the memory device 600, each channel may further include a read-write circuit and a read-write control circuit.

The read-write circuit may be configured to receive the testing instruction from the testing control circuit, to write first write data to a target normal memory cell in the memory cell array of the corresponding channel in response to the testing instruction, to compare first read data read from the target normal memory cell with the first write data, and to output an indication signal indicating that the target normal memory cell passes or fails the testing based on a result of the comparison.

The read-write control circuit may be configured to control the read-write circuit, to take the access address of the target normal memory cell as the failure address when the indication signal indicates that the target normal memory cell fails the testing, and to return the failure address to the testing control circuit.

For example, in the embodiment of FIG. 6, the channel 1 may further include the read-write circuit 1 and the read-write control circuit 1. The channel 2 may further include a read-write circuit 2 and a read-write control circuit 2.

The read-write circuit 1 may receive a testing instruction from the testing control circuit, and write first write data to the target normal memory cell in the memory cell array 1 of the channel 1 in response to the received testing instruction. For example, if the data is written in rows, it is assumed that the first write data is first written to the normal memory cell 1 to the normal memory cell 4 of the normal cell array 1, the first read data is then read in rows from the normal memory cell 1 to the normal memory cell 4 of the normal cell array 1, if the first write data and the corresponding first read data are consistent with each other, this indicates that the corresponding normal memory cell passes the testing, and if the first write data and the corresponding first read data are inconsistent with each other, this indicates that the corresponding normal memory cell fails the testing. The testing is performed sequentially row by row, an indication signal of the normal memory cell which passes or fails the testing in each row of the entire normal cell array 1 may be obtained. The access address of the normal memory cell which fails the testing is returned to the testing control circuit as the failure address.

In an exemplary embodiment, the read-write control circuit may further be configured to control the read-write circuit to write second write data to be written to the target normal memory cell designated by the failure address to the target spare memory cell designated by the repair address.

According to the memory device provided by the implementation mode of the disclosure, the normal memory cells in the memory cell array of each channel are tested before the memory device is delivered. It is determined whether the read data and the write data are consistent by comparison, to obtain the failure address of the unavailable normal memory cell, the failure address is then stored in the non-volatile memory cell array. In this way, when a read-write operation is subsequently performed on the normal memory cell in the memory device, the target spare memory cell represented by the repair address corresponding to the failure address may be used to replace the corresponding unavailable normal memory cell to perform reading and writing of the data.

Figure 7:
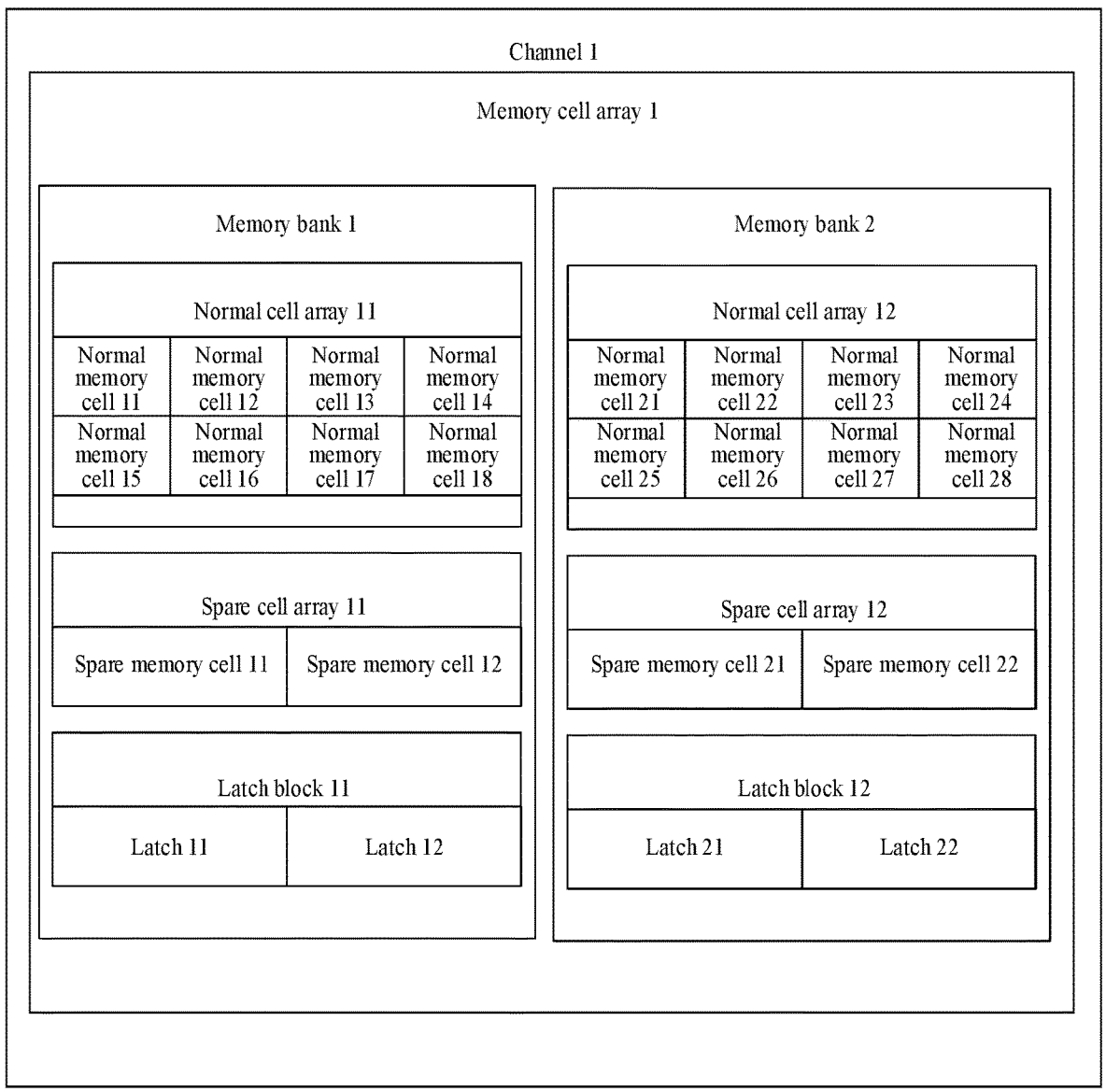
FIG. 7 schematically shows a schematic diagram of a channel according to an embodiment of the disclosure.

FIG. 7 schematically shows a schematic diagram of a channel according to an embodiment of the disclosure. The memory cell array of any channel in the memory device in any above embodiment is taken as an example, each memory cell array may include a plurality of memory banks.

For example, in FIG. 7, the channel 1 is taken as an example, the fact that the memory cell array 1 in the channel 1 includes two memory banks (that is, the memory bank 1 and the memory bank 2) is taken as an example, but in fact, the number of the memory banks included in each memory cell array may be arranged according to an actual application scenario, and the disclosure does not limit this.

In FIG. 7, it is assumed that the memory bank 1 includes the normal cell array 11, and the normal cell array 11 is assumed to include the normal memory cell 11 to the normal memory cell 18. It is assumed that the memory bank 2 includes the normal cell array 12, and the normal cell array 12 is assumed to include the normal memory cell 21 to the normal memory cell 28. The normal cell array 1 in the above embodiment may include the normal cell array 11 and the normal cell array 12 in the embodiment of the disclosure.

In the embodiment of the disclosure, the plurality of memory banks in each channel may share the spare cell array and the latch block of the corresponding channel, the spare cell array of the corresponding channel may include the first number (in FIG. 7, it is assumed to be equal to 4) of spare memory cells (for example, the spare memory cell 11, the spare memory cell 12, the spare memory cell 21, and the spare memory cell 22 in FIG. 7), each spare memory cell is a volatile memory cell, the latch block of each channel may include the first number of latches (for example, the latch 11, the latch 12, the latch 21, and the latch 22 in FIG. 7).

As shown in FIG. 7, the spare cell array 1 in the memory cell array 1 in the channel 1 is assumed to include the spare cell array 11 arranged in the memory bank 1 and the spare cell array 12 arranged in the memory bank 2, and the latch block 1 is assumed to include the latch block 11 arranged in the memory bank 1 and the latch block 12 arranged in the memory bank 2. It is assumed that the spare cell array 11 in the memory bank 1 includes the spare memory cell 11 and the spare memory cell 12, and the spare cell array 12 in the memory bank 2 includes the spare memory cell 21 and the spare memory cell 22. It is assumed that the latch block 11 in the memory bank 1 includes the latch 11 and the latch 12, and the latch block 12 in the memory bank the 2 includes the latch 21 and the latch 22.

Although in the embodiment of FIG. 7, the spare cell array and the latch block may be distributed to the memory banks, a plurality of memory banks in the same channel may share all the spare cell arrays and latch blocks in the channel during deployment and usage.

For example, in FIG. 7, if more than two rows of normal memory cells in the memory bank 1 fail the testing, it is assumed that only two latches are in the latch block 11, only two failure addresses of the access addresses of the normal memory cells of the corresponding two rows can be stored in the latch block 1, and correspondingly, the access addresses of the two spare memory cells in the spare cell array 11 may be adopted as the repair addresses of the two failure addresses. At this time, the failure addresses corresponding to the access addresses of the normal memory cells of the other rows in the rest memory bank 1 which fails the testing may be stored in the latches of the latch block 12 in the memory bank 2, and correspondingly, the access addresses of the spare memory cells in the spare cell array 12 are adopted as the repair addresses of the failure addresses stored in the latches of the latch block 12.

In the embodiment of FIG. 7, it may also be arranged that the spare memory cell 11 corresponds to the latch 11, the spare memory cell 12 corresponds to the latch 12, the spare memory cell 21 corresponds to the latch 21, and the spare memory cell 22 corresponds to the latch 22.

Figure 8:
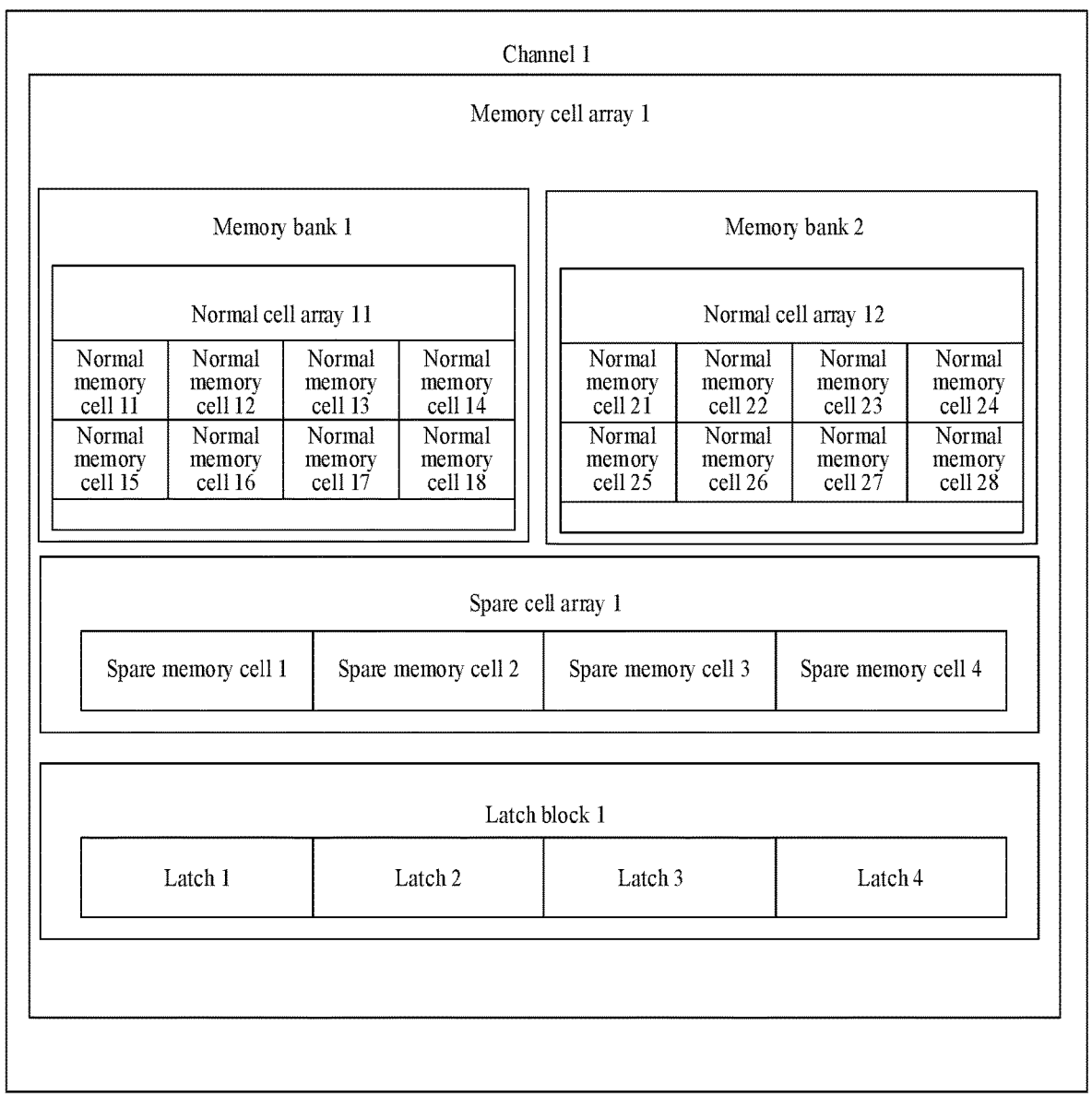
FIG. 8 schematically shows a schematic diagram of a channel according to an embodiment of the disclosure.

FIG. 8 schematically shows a schematic diagram of a channel according to an embodiment of the disclosure.

The difference from the embodiment of FIG. 7 lies in that, in the embodiment of FIG. 8, in order to implement that the plurality of memory banks in each channel share the spare cell array and the latch block of the corresponding channel, the spare cell array and the latch block may not be arranged in each memory bank, and the spare cell array and the latch block of the corresponding channel may be centrally arranged outside the plurality of memory banks.

For example, in FIG. 8, the memory bank 1 includes the normal cell array 11, the normal cell array 11 is assumed to include the normal memory cell 11 to the normal memory cell 18, the memory bank 2 includes the normal cell array 12, and the normal cell array 12 includes the normal memory cell 22 to the normal memory cell 28. The spare cell array 1 is centrally arranged in the memory cell array 1 of the channel 1 and outside the memory bank 1 and the memory bank 2, and the spare cell array 1 includes the spare memory cell 1 to the spare memory cell 4. The latch block 1 is centrally arranged in the memory cell array 1 of the channel 1 and outside the memory bank 1 and the memory bank 2, and the latch block 1 includes the latch 1 to the latch 4.

In the embodiment of FIG. 8, the spare memory cell 1 to the spare memory cell 4 may also be arranged to be in one-to-one correspondence with the latch 1 to the latch 4 respectively.

According to the memory device provided by the implementation mode of the disclosure, when the normal memory cell in each channel is divided into a plurality of memory banks, no matter whether the latches and the spare memory cells in each channel are distributed in the memory banks or centrally arranged in the corresponding channel, by sharing the latches in the latch block and the spare memory cells in the spare cell array in each channel, the problem that a relatively large number of the unavailable normal memory cells in some channels causes lack of enough latches and spare memory cells, while a relative small number of the unavailable normal memory cells in some other channels causes idle latches and spare memory cells is avoided. By uniformly scheduling the latches and spare memory cells in each channel, equalization may be achieved.

Figure 9:
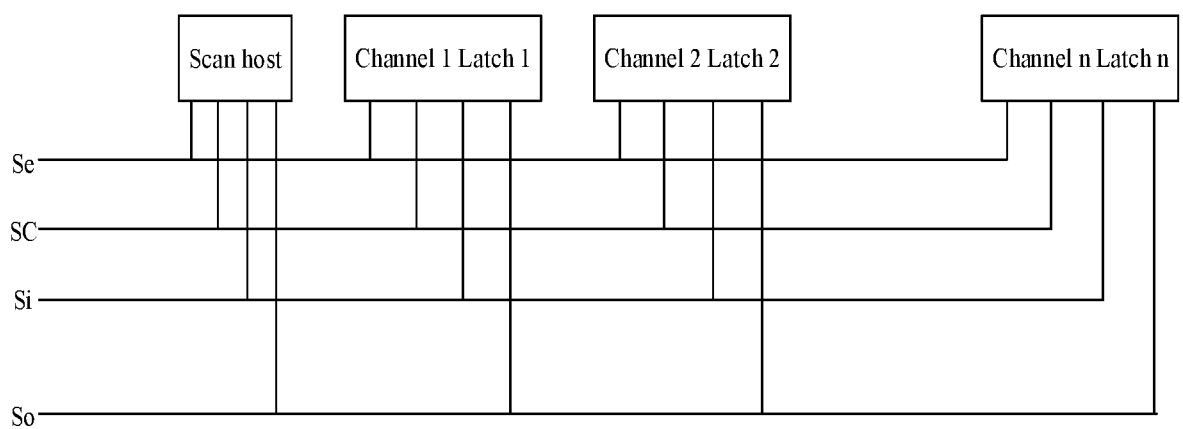
FIG. 9 schematically shows a schematic diagram of a scan host and each interface of a latch block of each channel according to an embodiment of the disclosure.
Figure 10:
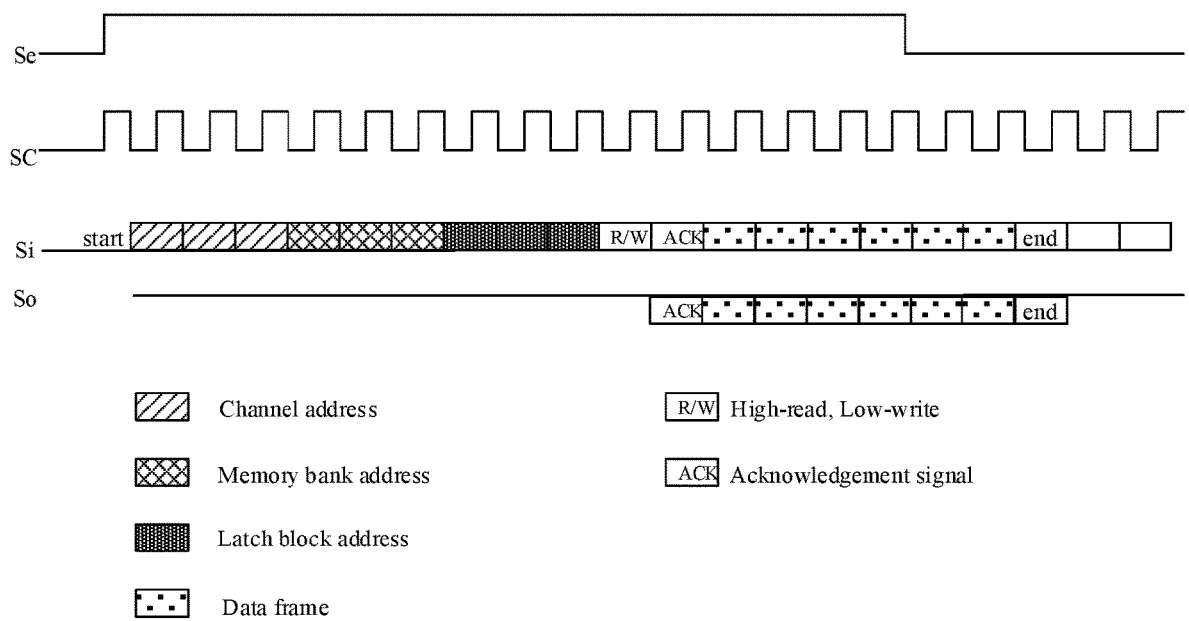
FIG. 10 schematically shows a timing sequence diagram of each signal in FIG. 9.

FIG. 9 schematically shows a schematic diagram of a scan host and each interface of a latch block of each channel according to an embodiment of the disclosure. FIG. 10 schematically shows a timing sequence diagram of each signal in FIG. 9. As can be seen from the above embodiment, the non-volatile memory cell array may further include a scan host.

In the embodiment of the disclosure, both the latch block of each channel and the scan host may include a first interface, a second interface, and a third interface.

For example, in FIG. 9 and FIG. 10, the first interface of the latch block of each channel and the first interface of the scan host may be configured to receive an enable signal Se; and the second interface of the latch block of each channel and the second interface of the scan host may be configured to receive a Signal of Clock (SC).

When the enable signal received by the first interface of the scan host is at a first level (for example, a high level in FIG. 10, but the disclosure is not limited herein, the first level may also be arranged to be a low level), according to the SC received by the second interface of the scan host, the third interface of the scan host may be configured to sequentially send a channel address, a memory bank address and a latch block address (sequentially transmitted through the Si signal in FIG. 10) to the third interface of the latch block (for example, the latch block 1 of the channel 1, the latch block 2 of the channel 2, to the latch block n of the channel n (n is a positive integer greater than or equal to 2)) of each channel, so that a target channel, a target memory bank of the target channel and a target latch in the target latch block corresponding to the target channel are determined from the plurality of channels.

After the above channel address, memory bank address and latch block address are sent from the third interface of the scan host to each latch block of each channel through the Si signal, a command (R/W) may be sent. For example, if the command is at the high level, the command is a read command, that is, a data frame is read from a target channel. If the command is at the low level, the command is a write command, that is, the data frame is written to the target channel, for example, the failure address is written to the latch of the target latch block of the target channel.

Here, it is assumed that the third interface of the scan host first sends one write command to the third interface of each latch block of each channel, after the third interface of the target latch block of the target channel receives the write command, an acknowledgement (ACK) signal is returned to the third interface of the scan host, and after the third interface of the scan host receives the acknowledgement signal, the data frame may be continued to be sent, through the third interface of the scan host, to the third interface of each latch block of each channel. The failure address is carried in the data frame, so that the failure address is transferred to the target latch.

According to the memory device provided by the implementation mode of the disclosure, through the first interface to the third interface and the corresponding enable signal, SC, and Si signal, the failure address may be correctly transferred from the non-volatile memory cell to the latch, so that the fast reading and writing of the normal cell array of each channel may be realized.

Still with reference to FIG. 9 and FIG. 10, further, both the latch block of each channel and the scan host further include a fourth interface. When the read command is sent from the third interface of the scan host to the third interface of the latch block of each channel, the data is read from the target latch through the fourth interface of the scan host (through the So signal), so as to compare the written failure address with the read data to verify whether the written failure address is written correctly.

According to the memory device provided by the implementation mode of the disclosure, on one hand, through the first interface to the third interface and the corresponding enable signal, SC, and Si signal, the failure address may be correctly transferred from the non-volatile memory cell to the latch, so that the fast reading and writing of the normal cell array of each channel may be realized. On the other hand, the failure address transferred to the target latch may be read through the fourth interface, whether the written failure address is correct is verified, and therefore, the correct reading and writing of the normal cell array of each channel may be ensured.

In the embodiment of the disclosure, each latch in each channel and each spare memory cell in the corresponding channel may be mapped one by one in advance. For example, it is assumed that there are 100 spare memory cells in one channel, 100 latches may be arranged or adopted. One latch corresponds to one spare memory cell. It is assumed that the failure address is stored to the fifth latch, and the access address of the fifth spare memory cell may be used as the repair address of the failure address. In this way, the latch does not need to store one failure address and the repair address thereof simultaneously.

It is to be noted that a manner of transferring the failure address is not limited to the example of the above FIG. 9 and FIG. 10.

In some embodiments, the sequence of sending the channel address, the memory bank address, and the latch block address may be changed. For example, the scan host may send the latch block address first. When a channel monitors that the latch block address and the latch block in the channel are consistent and the latch block in the channel is available, the acknowledgement signal may be returned to the scan host. In this way, the scan host may determine in advance whether the target latch block of the target channel is available, and therefore, it can be learned quickly whether the failure address can be continued to be sent to the target channel.

In some embodiments, when starting of a write operation of the failure address is enabled through the enable signal, the scan host may determine which target channel the failure address is currently written to through sending the channel address, after the target channel receives the channel address, the scan host may also reply to the scan host with an acknowledgement signal, to inform the scan host that the channel address is normally monitored, and therefore, the scan host may continue to send relevant data of the failure address to the target channel. The scan host then sends the memory bank address to inform that the normal memory cell corresponding to the current failure address to be stored is in which target memory bank in the target channel, and then sends the latch block address to inform which target latch in the target latch block of the target channel the failure address is to be stored to, and therefore, it may be determined how to transfer the failure address to the corresponding latch of the corresponding channel.

In some embodiments, the fourth interface of the target latch block corresponding to the target channel may be configured to send the acknowledgement signal to the fourth interface of the scan host after receiving the latch block address, to inform the scan host that the latch block address is received. After receiving the latch block address, the fourth interface of the latch blocks other than the target latch block corresponding to the channels other than the target channel compares the latch block address with its own latch block address, and does not send the acknowledgement signal to the fourth interface of the scan host if the latch block addresses are inconsistent.

Figure 11:
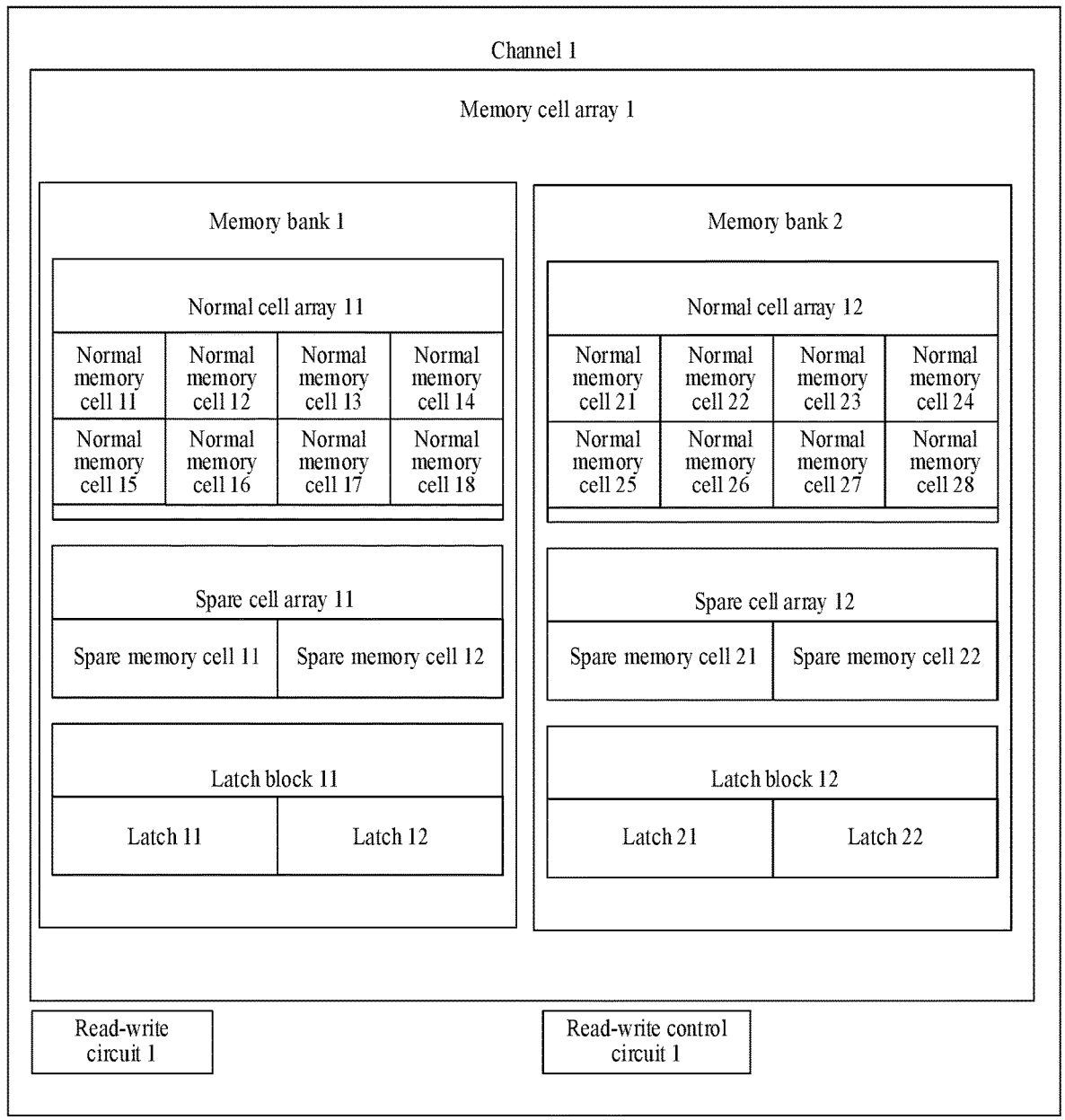
FIG. 11 schematically shows a schematic diagram of a channel according to an embodiment of the disclosure.

FIG. 11 schematically shows a schematic diagram of a channel according to an embodiment of the disclosure.

In the embodiment of the disclosure, each channel further includes a read-write circuit and a read-write control circuit. When each channel includes a plurality of memory banks, the read-write control circuit is configured to control the read-write circuit to alternately read and write the memory banks in the memory cell array.

For example, the embodiment of FIG. 7 is illustrated. In FIG. 11, the channel 1 is taken as an example, it is assumed that the memory cell array 1 of the channel 1 includes the memory bank 1 and the memory bank 2, and the channel 1 further includes the read-write circuit 1 and the read-write control circuit 1. The read-write control circuit 1 may then control the read-write circuit 1 to alternately read and write the memory bank 1 and the memory bank 2 in the memory cell array 1.

According to the memory device provided by the implementation mode of the disclosure, the fact that the reading and writing in the memory bank are not completed in real time is also taken into consideration, by enabling the memory banks in the same channel to alternately read and write, the operation speed of the same channel may be faster, and it seems from the outside that the memory device reads and writes data in real time, so that the overall read-write speed of each channel is improved.

Figure 12:
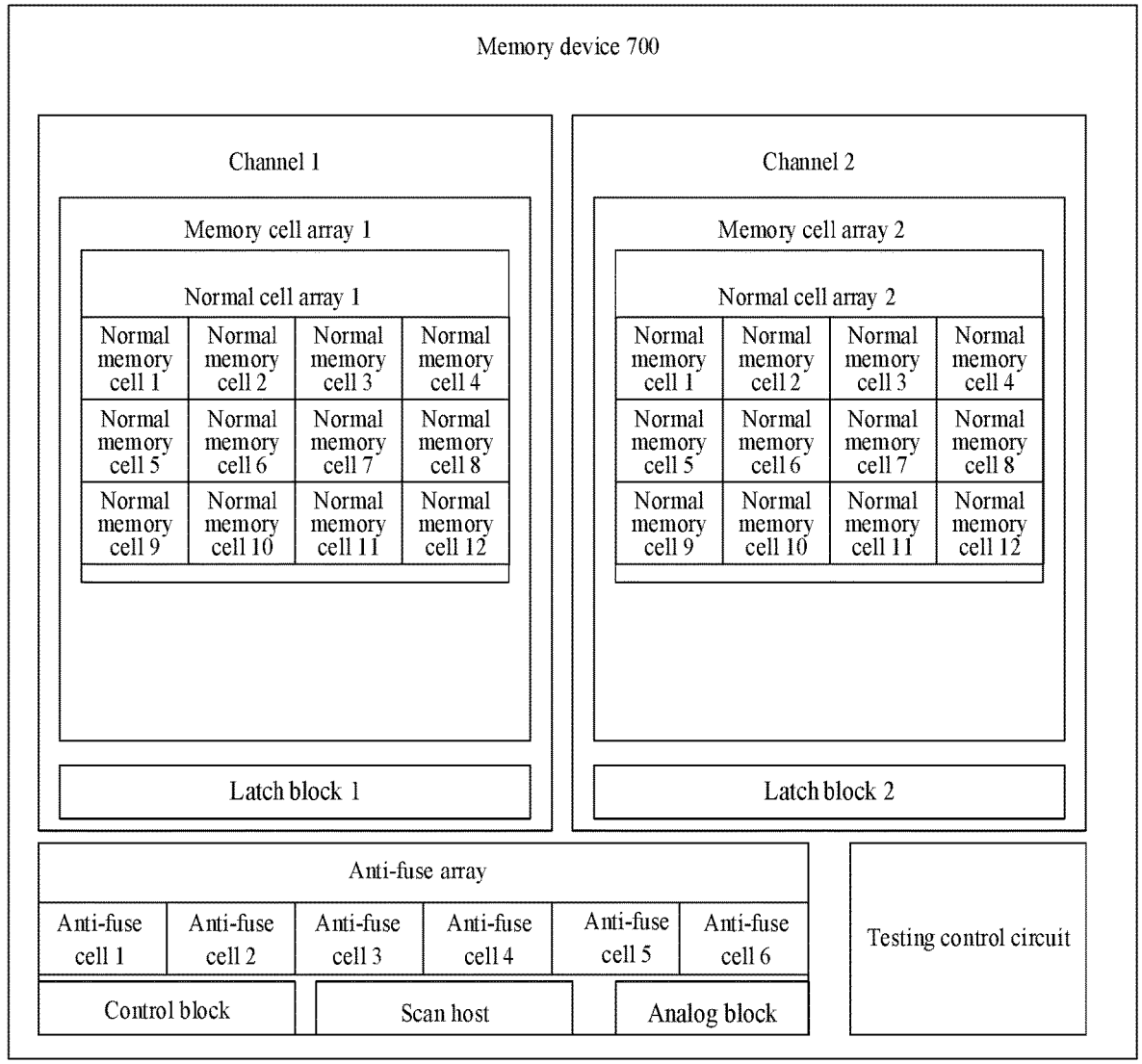
FIG. 12 schematically shows a schematic diagram of a memory device according to an embodiment of the disclosure.

FIG. 12 schematically shows a schematic diagram of a memory device according to an embodiment of the disclosure.

The difference between the memory device 700 provided by FIG. 12 and the above memory device 400 provided by FIG. 4 lies in that, in the memory device 700, the anti-fuse array may further include an analog block. The analog block may be configured to provide a power supply voltage to the anti-fuse cell in the anti-fuse array.

According to the memory device provided by the implementation mode of the disclosure, a high voltage required by the anti-fuse cell is taken into consideration, and an analog block may be arranged in the anti-fuse array to provide the high voltage required for the read-write operation of the anti-fuse cell, so that the normal reading and writing of the anti-fuse cell may be realized.

Figure 13:
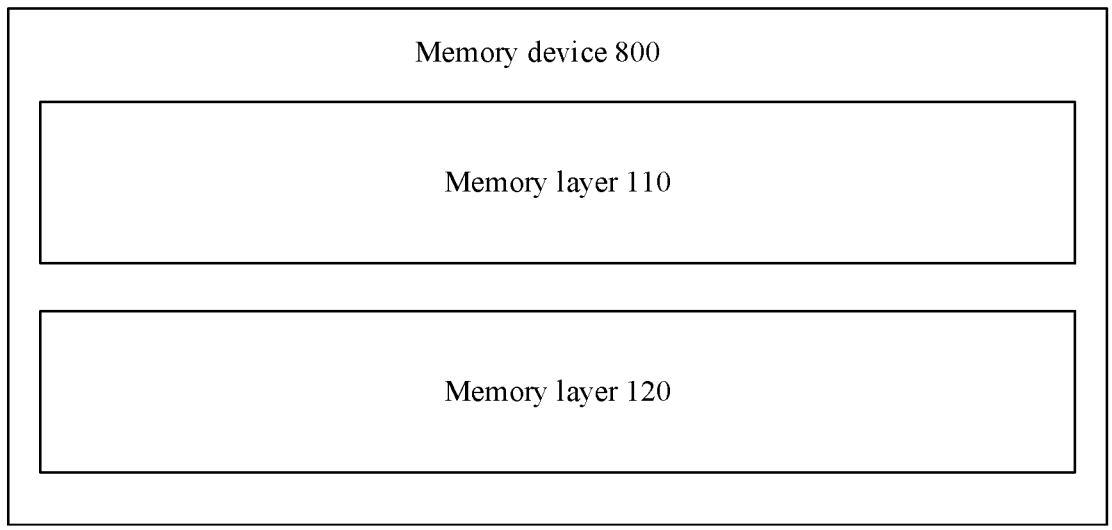
FIG. 13 schematically shows a schematic diagram of a memory device according to an embodiment of the disclosure.

FIG. 13 schematically shows a schematic diagram of a memory device according to an embodiment of the disclosure.

As shown in FIG. 13, a memory device 800 provided by the embodiment of the disclosure may include a plurality of memory layers (for example, the memory layer 110 and the memory layer 120) vertically stacked, this is merely an example, and in fact, more than two layers of memories may be included.

In the embodiment of the disclosure, each memory layer includes at least one channel.

In an exemplary embodiment, each memory layer may include one channel, in other words, the number of the memory layers in the memory device 800 is the same as that of the channels, and the plurality of channels corresponding to the plurality of memory layers may share the same anti-fuse array. However, the disclosure is not limited herein.

According to the memory device provided by the implementation mode of the disclosure, the plurality of memory layers are vertically stacked, so that more memory cell arrays may be accommodated in the same memory device, meanwhile, the area of the memory device is not increased, and a high bandwidth requirement can be met. The plurality of channels share the same anti-fuse array, so that the anti-fuse array can be uniformly scheduled in the plurality of channels, an equalization function is realized, and the problem that a relatively large number of the unavailable normal memory cells in some channels causes lack of enough anti-fuse cells to store the failure address, while a relative small number of the unavailable normal memory cells in some other channels causes idle anti-fuse cells is avoided. Meanwhile, the failure addresses of the unavailable normal memory cells in the plurality of channels are centrally stored through the anti-fuse array, the area occupied by the anti-fuse array is reduced, the integration level of the memory device is improved, and the complexity of the manufacturing process is reduced.

Figure 14:
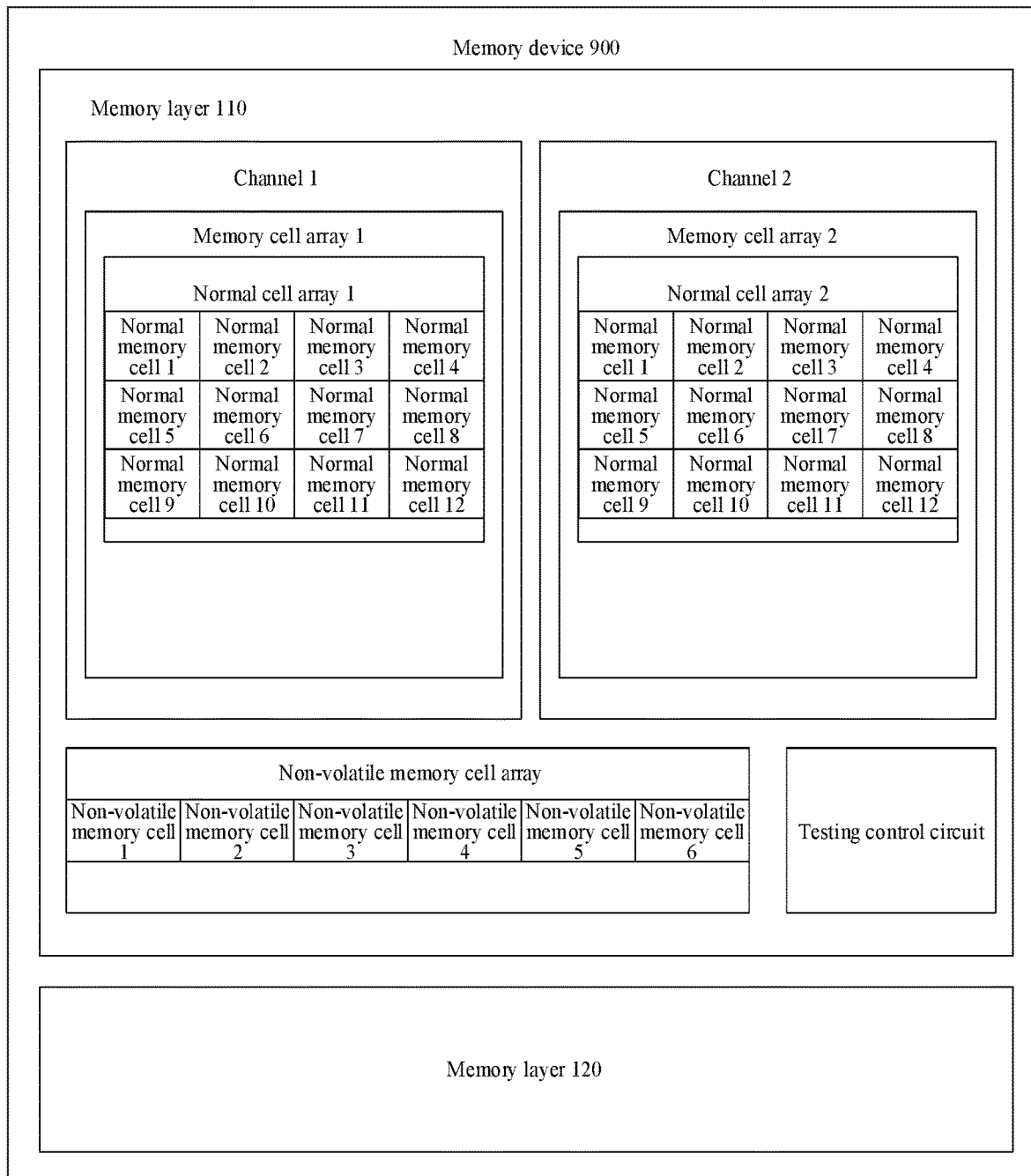
FIG. 14 schematically shows a schematic diagram of a memory device according to an embodiment of the disclosure.

FIG. 14 schematically shows a schematic diagram of a memory device according to an embodiment of the disclosure.

In the embodiment of FIG. 14, each memory layer may include the plurality of channels, the testing control circuit, and the non-volatile memory cell array. That is, the plurality of channels in each memory layer share the same non-volatile memory cell array, and the plurality of channels in different memory layers use different non-volatile memory cell arrays.

For example, in FIG. 14, it is assumed that a memory device 900 includes the memory layer 110 and the memory layer 120, and it is assumed that the memory layer 110 includes the channel 1 and the channel 2. The description of the channel 1 and the channel 2 may refer to the above embodiment. Similarly, the memory layer 120 may include the channel 1 and the channel 2.

According to the memory device provided by the implementation mode of the disclosure, the plurality of memory layers are vertically stacked and each memory layer includes the plurality of channels, so that more memory cell arrays may be accommodated in the same memory device, meanwhile, the area of the memory device is not increased, and a high bandwidth requirement is further met. The plurality of channels in each memory layer share the same anti-fuse array, so that the anti-fuse array can be uniformly scheduled in the plurality of channels, an equalization function is realized, and the problem that a relatively large number of the unavailable normal memory cells in some channels causes lack of enough anti-fuse cells to store the failure address, while a relative small number of the unavailable normal memory cells in some other channels causes idle anti-fuse cells is avoided. Meanwhile, the failure addresses of the unavailable normal memory cells in the plurality of channels in each memory layer are centrally stored through the anti-fuse array, the area occupied by the anti-fuse array is reduced, the integration level of the memory device is improved, and the complexity of the manufacturing process is reduced.

Figure 15:
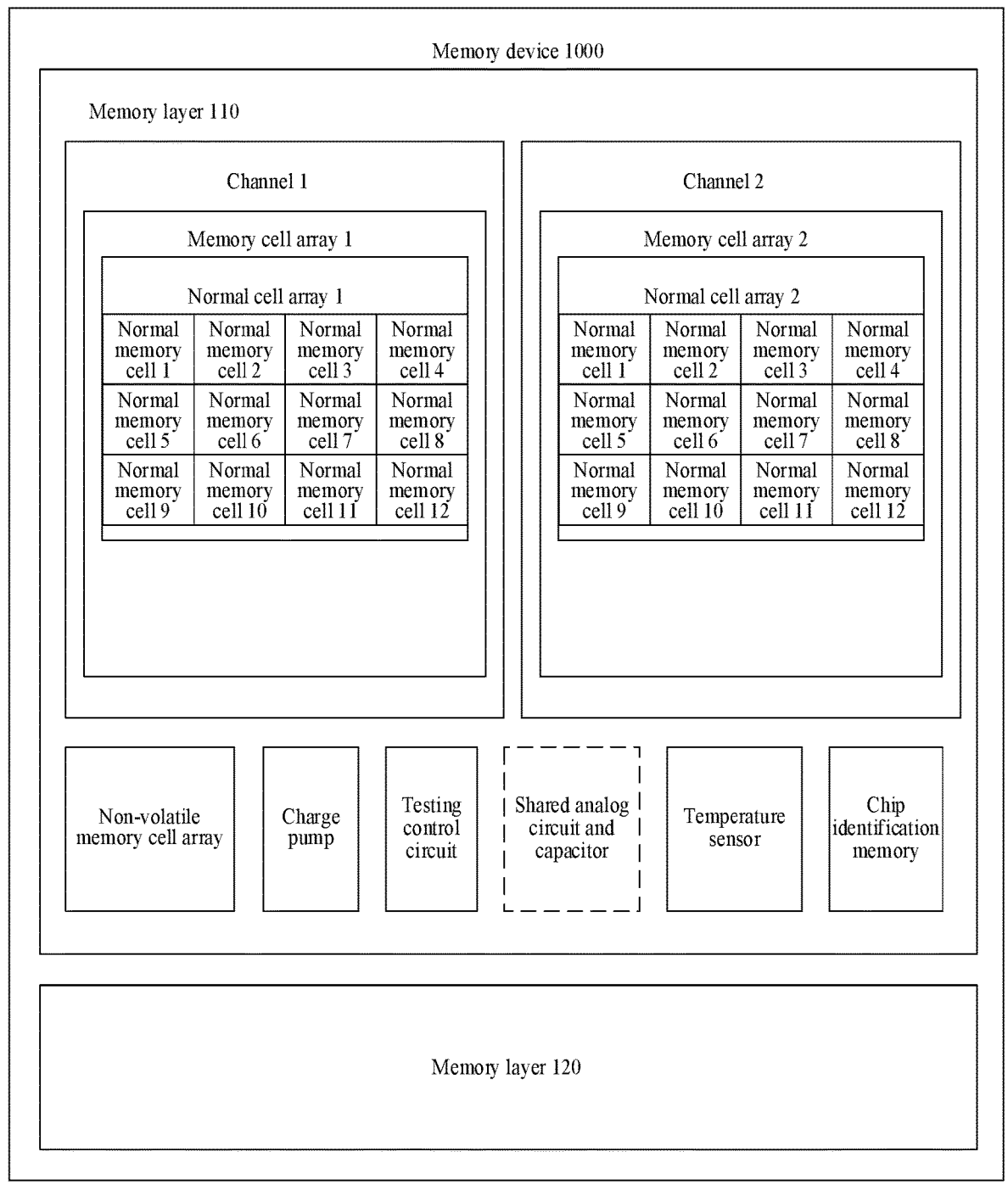
FIG. 15 schematically shows a schematic diagram of a memory device according to an embodiment of the disclosure.

FIG. 15 schematically shows a schematic diagram of a memory device according to an embodiment of the disclosure.

As shown in FIG. 15, each memory layer in a memory device 1000 provided by the embodiment of the disclosure may further include at least one of a charge pump, a temperature sensor, or a chip identification memory device.

The charge pump may be configured to provide power for the plurality of channels, the testing control circuit, and/or the non-volatile memory cell array of the corresponding memory layer.

The temperature sensor may be configured to test the temperature of the plurality of channels, the testing control circuit, and/or the non-volatile memory cell array of the corresponding memory layer.

The chip identification memory device may be configured to store chip identification information of the corresponding memory layer.

Still with reference to FIG. 15, each memory layer of the memory device 1000 may further include a shared analog circuit and capacitor. That is, the plurality of channels in each memory layer in the embodiment of the disclosure may share the same non-volatile memory cell array, charge pump, testing control circuit, shared analog circuit and capacitor, temperature sensor, and chip identification memory device.

The following description is give by taking that the memory device is a Dynamic Random Access Memory (DRAM) as an example, but the disclosure is not limited herein, and the memory device may be any device capable of implementing a memory function.

Figure 16:
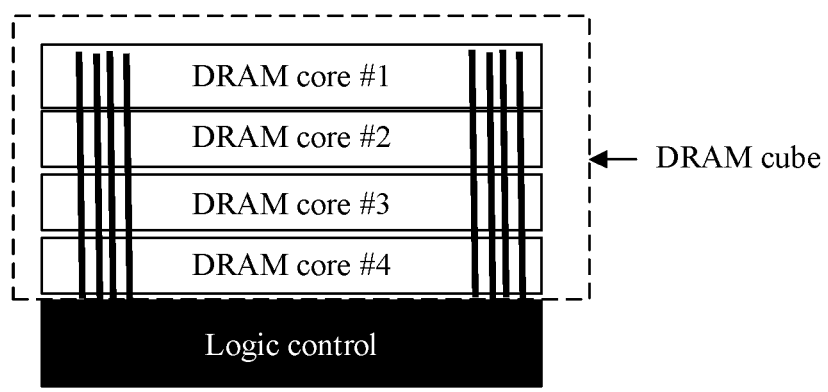
FIG. 16 schematically shows a schematic diagram of a 3-dimensional integrated circuit according to an embodiment of the disclosure.

FIG. 16 schematically shows a schematic diagram of a 3-dimensional integrated circuit according to an embodiment of the disclosure.

As shown in FIG. 16, a 3-dimension (3D) vertically stacked DRAM cube is taken as an example, and a DRAM core #4, a DRAM core #3, a DRAM core #2, and a DRAM core #1 are sequentially vertically stacked on a logic control circuit.

The 3-dimensional stacked DRAM is a new type of memory formed by stacking a plurality of layers of DRAMs by using a 3D packaging technology, which can provide large memory capacity and memory bandwidth.

Figure 17:
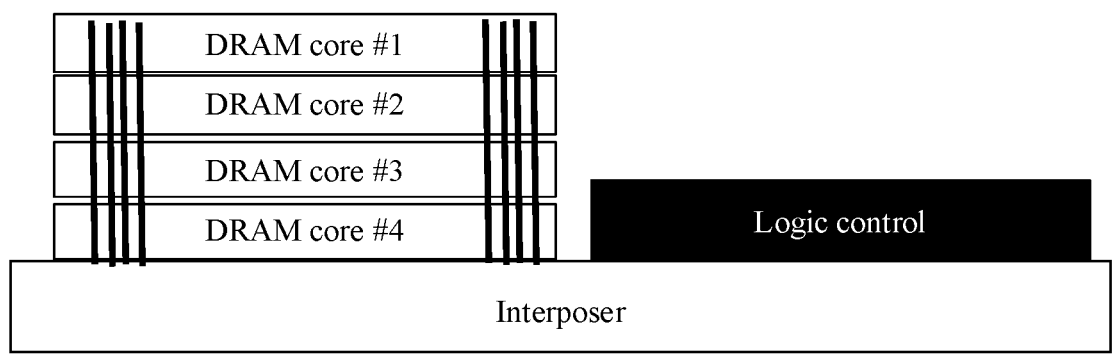
FIG. 17 schematically shows a schematic diagram of a 2.5-dimensional integrated circuit according to an embodiment of the disclosure.

FIG. 17 schematically shows a schematic diagram of a 2.5-dimensional (2.5D) integrated circuit according to an embodiment of the disclosure.

As shown in FIG. 17, the DRAM core #4, the DRAM core #3, the DRAM core #2, and the DRAM core #1 are sequentially vertically stacked on an interposer, and meanwhile, the logic control circuit is arranged on the interposer. At this time, data communication between the logic control circuit and each DRAM core is implemented through the interposer.

It is to be noted that in FIG. 16 and FIG. 17, four vertically stacked DRAM cores are taken as an example, but in fact, the disclosure does not limit the number of vertically stacked DRAM cores.

Figure 18:
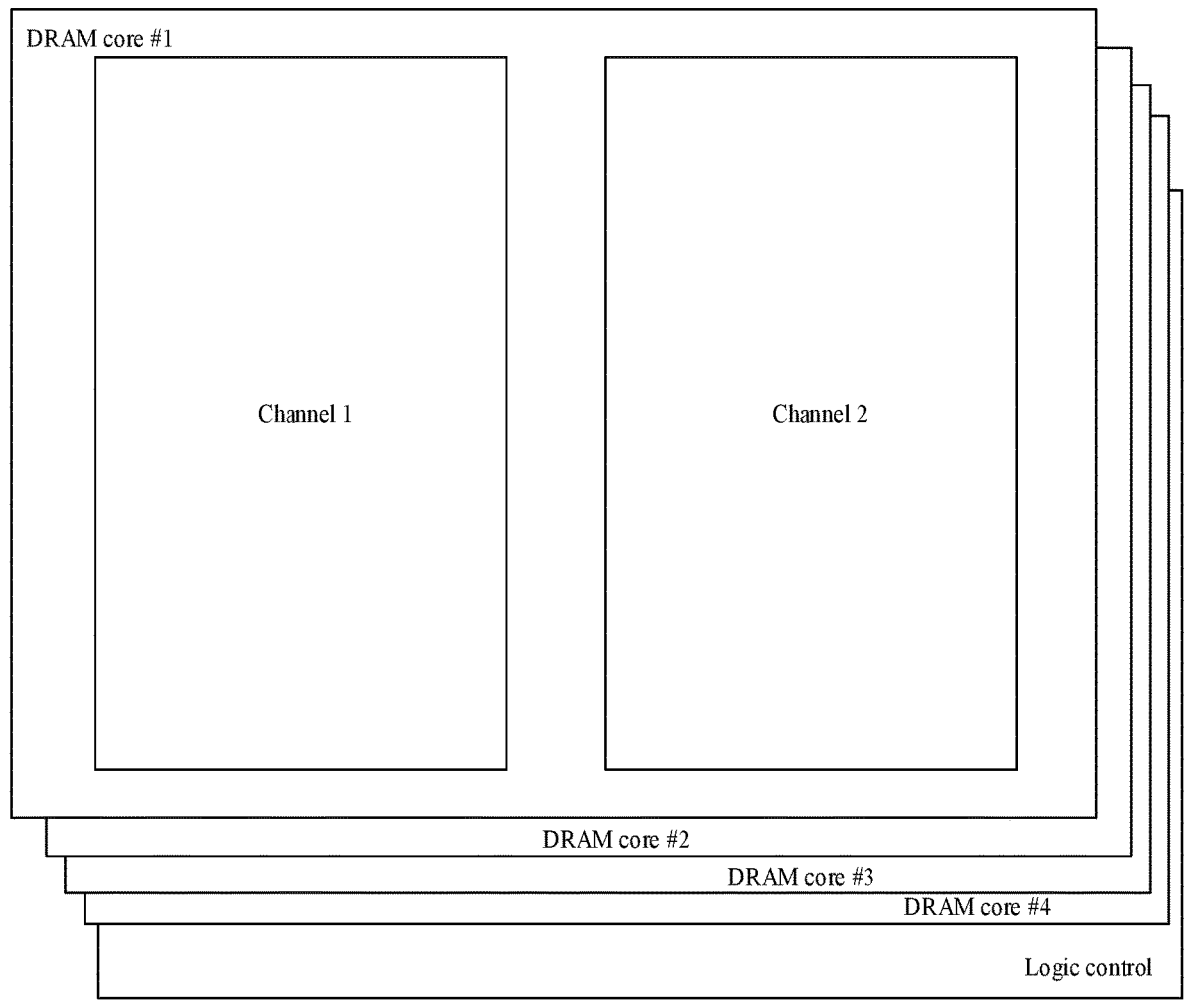
FIG. 18 schematically shows a schematic diagram of a 3-dimensional integrated circuit according to an embodiment of the disclosure.

FIG. 18 schematically shows a schematic diagram of a 3-dimensional integrated circuit according to an embodiment of the disclosure.

The 3-dimensional integrated circuit of the above FIG. 16 is taken as an example, in the embodiment of FIG. 18, it is assumed that each DRAM core includes two channels, for example, each of the DRAM core #4, the DRAM core #3, the DRAM core #2, and the DRAM core #1 includes the channel 1 and the channel 2 respectively.

Each channel may include a single DRAM chip, a plurality of DRAM chips in a plurality of channels may be integrated into one memory layer, and the logic control circuit may control a pin(s) of each channel independently, or control pins of the channels simultaneously.

Each channel may include, for example, 64 normal data pins and may further include 8 Error Correcting Code (ECC) check pins. The ECC check pin may be configured to perform error detection and correcting on data provided from each channel, may detect whether the data has an error, and may correct the error.

Figure 19:
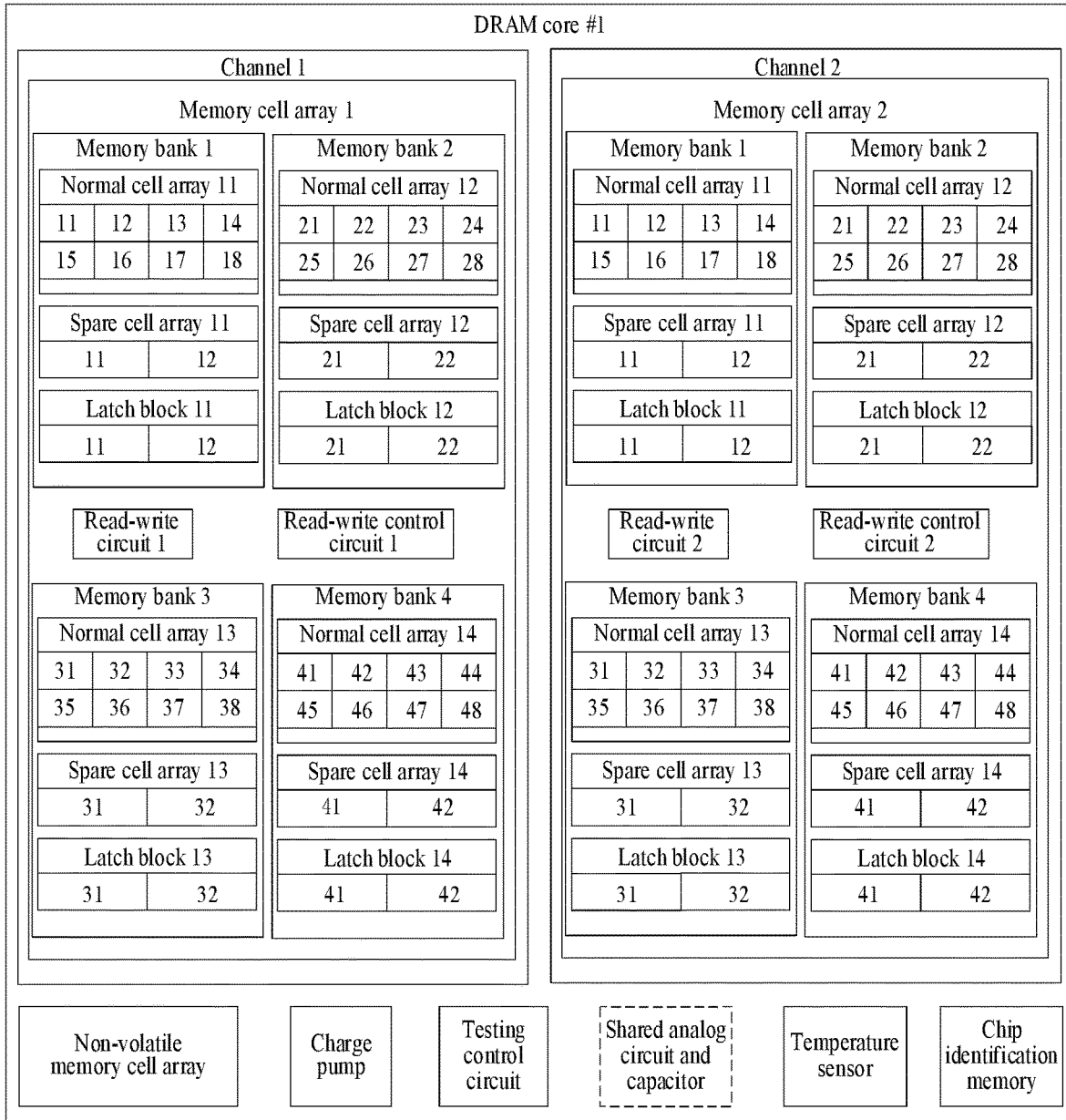
FIG. 19 schematically shows a schematic diagram of a memory layer in a 3-dimensional integrated circuit according to an embodiment of the disclosure.

FIG. 19 schematically shows a schematic diagram of a memory layer in a 3-dimensional integrated circuit according to an embodiment of the disclosure.

As shown in FIG. 19, the fact that the DRAM core #1 is used as one memory layer in the memory device is taken as an example, the DRAM core #1 includes the channel 1 and the channel 2, the channel 1 and the channel 2 share the same non-volatile memory cell array, charge pump, testing control circuit, shared analog circuit and capacitor, temperature sensor, and chip identification memory device.

In FIG. 19, it is assumed that the memory cell array of each channel includes four memory banks. For example, the memory cell array 1 in the channel 1 includes the memory bank 1 to the memory bank 4, and the memory cell array 2 in the channel 2 includes the memory bank 1 to the memory bank 4.

In the embodiment of FIG. 19, it is assumed that the spare cell array and the latch block are shared by a plurality of memory banks in the memory cell array of each channel, and the shared spare cell array and the latch block are distributed among the memory banks, that is, the spare memory cells in the spare cell array and the latches in the latch block in the same channel are scheduled uniformly.

For example, the normal cell array 11 (it is assumed that the normal memory cell 11 to the normal memory cell 18 are included in the normal cell array 11), the spare cell array 11 (it is assumed that the spare memory cell 11 and the spare memory cell 12 are included in the spare cell array 11), and the latch block 11 (it is assumed that latch 11 and latch 12 are included in the latch block 11) are arranged in the memory bank 1 in the memory cell array 1 in the channel 1. The normal cell array 12 (it is assumed that the normal memory cell 21 to the normal memory cell 28 are included in the normal cell array 12), the spare cell array 12 (it is assumed that the spare memory cell 21 and the spare memory cell 22 are included in the spare cell array 12), and the latch block 12 (it is assumed that the latch 21 and the latch 22 are included in the latch block 12) are arranged in the memory bank 2. The normal cell array 13 (it is assumed that the normal memory cell 31 to the normal memory cell 38 are included in the normal cell array 13), the spare cell array 13 (it is assumed that the spare memory cell 31 and the spare memory cell 32 are included in the spare cell array 13), and the latch block 13 (it is assumed that the latch 31 and the latch 32 are included in the latch block 13) are arranged in the memory bank 3. The normal cell array 14 (it is assumed that the normal memory cell 41 to the normal memory cell 48 are included in the normal cell array 14), the spare cell array 14 (it is assumed that the spare memory cell 41 and the spare memory cell 42 are included in the spare cell array 14), and the latch block 14 (it is assumed that the latch 41 and the latch 42 are included in the latch block 14) are arranged in the memory bank 4.

If the number of the failure addresses in any one memory bank in the channel 1 exceeds the number of latches of the latch block arranged therein, the latch of the latch block in any other one or more memory banks in channel 1 may be called to store the rest failure address, and the access address of the spare memory cell of the spare cell array in any other one or more memory banks may also be used as a repair address of the rest failure address.

In the embodiment of FIG. 19, each of spare memory cells in the spare cell array in each memory bank may correspond to a respective one of the latches in the latch block in the corresponding memory bank.

In the embodiment of FIG. 19, the read-write control circuit 1 in the channel 1 may control the read-write circuit 1 to alternately read and write the memory bank 1 to the memory bank 4 in turn.

The description of the channel 2 in the FIG. 19 may refer to the channel 1.

Figure 20:
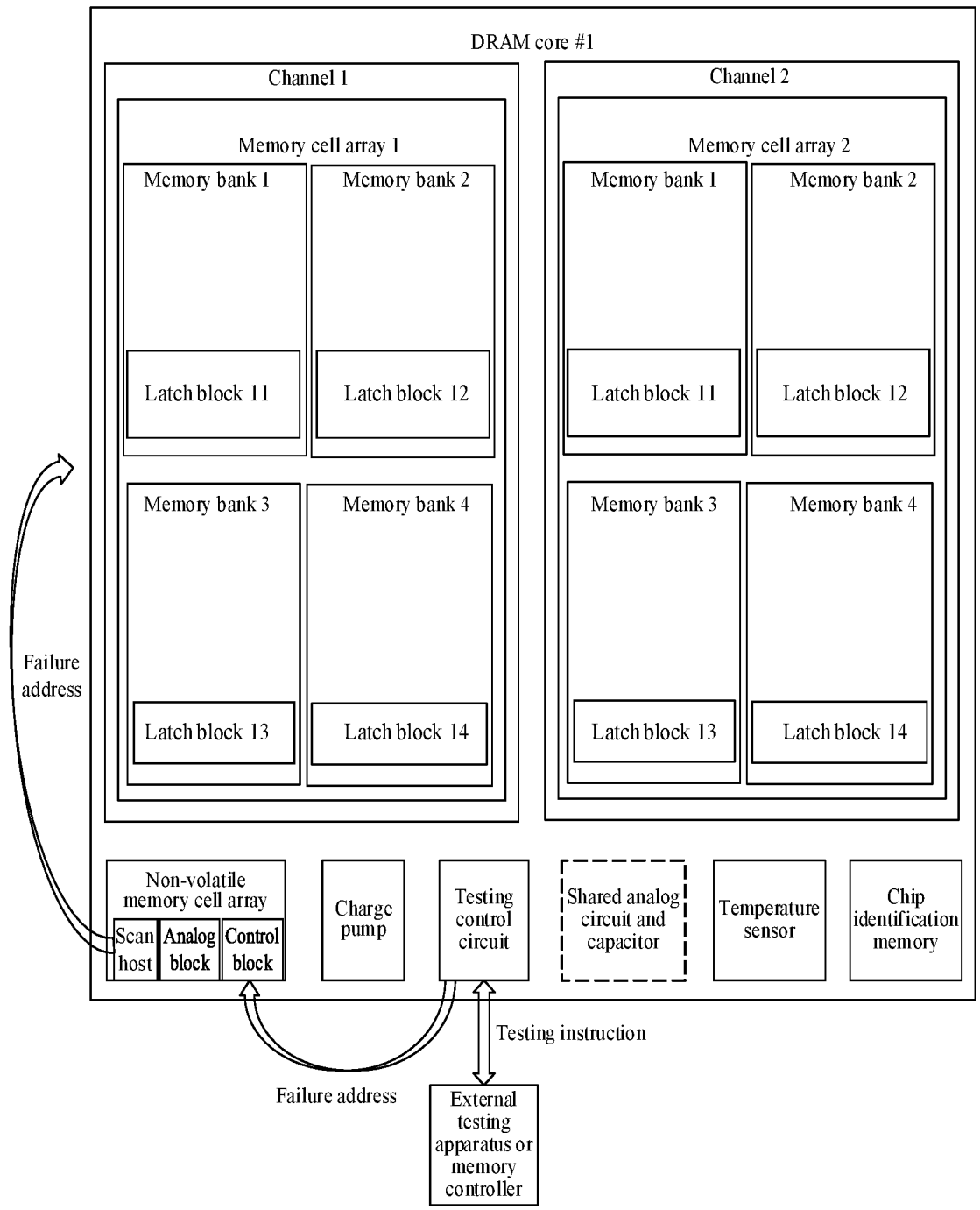
FIG. 20 schematically shows a schematic diagram of a memory layer in a 3-dimensional integrated circuit according to an embodiment of the disclosure.

FIG. 20 schematically shows a schematic diagram of a memory layer in a 3-dimensional integrated circuit according to an embodiment of the disclosure.

As shown in FIG. 20, the DRAM core #1 is still taken as an example. In a testing phase, a testing control circuit may receive a testing instruction from an external testing apparatus or a memory controller in a memory system including the DRAM core #1, in response to the testing instruction, the normal cell array 11 to the normal cell array 14 in the memory bank 1 to the memory bank 4 in the memory cell array 1 of the channel 1 and the normal cell array 11 to the normal cell array 14 in the memory bank 2 to the memory bank 4 in the memory cell array 2 of the channel 2 are tested, and the access address of the normal memory cell which fails the testing is obtained as the failure address.

Then, the testing control circuit sends the obtained failure address to the control block of the anti-fuse array, and the failure address is stored to the anti-fuse cell of the anti-fuse array through the control block.

In a usage phase, when the DRAM core #1 is powered on, the scan host transfers the failure address stored in the anti-fuse cell of the anti-fuse array to the corresponding latch block of the corresponding channel.

An implementation mode of the disclosure further provides a memory system. The memory system may include: at least one memory layer and a memory controller. The memory controller may be configured to control the at least one memory layer.

The memory controller may provide an address, a command, and a control signal to each memory layer to control a programming (or writing) operation and a read operation of the memory layer. For example, the command may be a read command or a write command. For example, the address may include a location to which data is written or from which data is read in each memory layer.

Each memory layer may include a plurality of channels, a testing control circuit, and a non-volatile memory cell array.

Each channel in the plurality of channels may include a memory cell array, the memory cell array may include a normal cell array, the normal cell array may include a plurality of normal memory cells, and each of the normal memory cells may be a volatile memory cell.

The testing control circuit may be configured to control testing of the normal cell array in the plurality of channels in response to a testing instruction and to determine an access address of a normal memory cell failing the testing in the normal cell array in each of the plurality of channels to be a failure address.

The non-volatile memory cell array may include a plurality of non-volatile memory cells. The non-volatile memory cell array may be configured to receive and store the failure address from the testing control circuit.

In an exemplary embodiment, the memory controller may be configured to provide the testing instruction to the testing control circuit.

In an exemplary embodiment, the memory system may be connected to an external testing apparatus, and the testing control circuit may receive the testing instruction from the external testing apparatus.

Other content of the memory system provided by the embodiment of the disclosure may refer to the description of the memory device in the above embodiment.

According to the memory device provided by the embodiment of the disclosure, on one hand, the memory device including a plurality of channels shares the same non-volatile memory cell array, so that a high bandwidth requirement may be met; and on the other hand, the non-volatile memory cells in the non-volatile memory cell array are used to store the failure address corresponding to the access address of the unavailable normal memory cell failing the testing in the normal cell array in the plurality of channels, so that after the memory cell array in each of the plurality of channels is powered off, it still can be learned which normal memory cell or which normal memory cells of the memory cell array in each of the plurality of channels are unavailable. In this way, after the memory device is powered on next time, retesting is not needed, so that the testing time and cost are reduced, the testing efficiency is improved, and meanwhile, the high-speed read-write performance of the volatile memory cells adopted by the memory cell array in each channel may be maintained.

Figure 21:
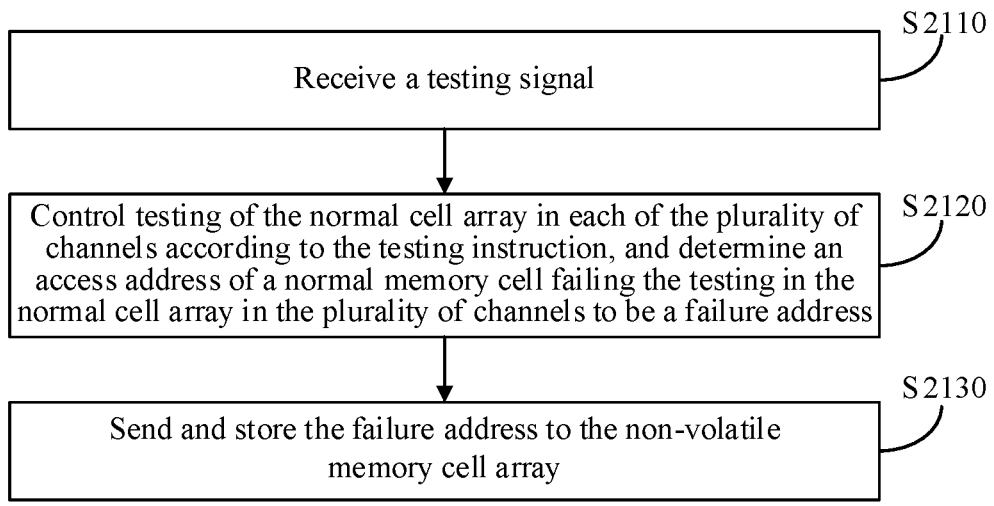
FIG. 21 schematically shows a flow chart of a method of testing a memory device according to an embodiment of the disclosure.

FIG. 21 schematically shows a flow chart of a method for testing a memory device according to an embodiment of the disclosure. The memory device may include a plurality of channels and a non-volatile memory cell array. Each of the channels may include a memory cell array, the memory cell array may include a normal cell array, the normal cell array may include normal memory cells, each of the normal memory cells may be a volatile memory cell, and the non-volatile memory cell array may include a plurality of non-volatile memory cells.

As shown in FIG. 21, the method provided by the embodiment of the disclosure may include the following steps.

In S2110, a testing instruction is received.

For example, the testing instruction may be provided to the testing control circuit through a memory controller or may be provided to the testing control circuit by an external testing apparatus connected to the memory device, and the embodiment of the disclosure does not limit a source of the testing instruction.

In S2120, testing of the normal cell array in each of the plurality of channels is controlled according to the testing instruction, and an access address of a normal memory cell failing the testing in the normal cell array in each of the plurality of channels is determined as a failure address.

In S2130, the failure address is sent and stored to the non-volatile memory cell array.

Other content of the method for testing a memory device provided by the embodiment of the disclosure may refer to the description of the above embodiments of the memory device and the memory system.

According to the method for testing a memory device provided by the embodiment of the disclosure, on one hand, the memory device including a plurality of channels share the same non-volatile memory cell array, so that a high bandwidth requirement may be met; and on the other hand, the non-volatile memory cells in the non-volatile memory cell array are used to store the failure address corresponding to the access address of the unavailable normal memory cell which fails the testing in the normal cell array in each of the plurality of channels, so that after the memory cell array in each of the plurality of channels is powered off, it can still be learned which normal memory cell or which normal memory cells of the memory cell array in each of the plurality of channels are unavailable. In this way, after the memory device is powered on next time, retesting is not needed, so that the testing time and cost are reduced, the testing efficiency is improved, and meanwhile, the high-speed read-write performance of the volatile memory cell adopted by the memory cell array in each channel may be maintained.

The implementation mode of the disclosure further provides a method for using a memory device. The memory device may include a plurality of channels and a non-volatile memory cell array. Each of the channels may include a memory cell array and a latch block, the memory cell array may include a normal cell array, the normal cell array includes normal memory cells, each of the normal memory cells may be a volatile memory cell, the non-volatile memory cell array may include a plurality of non-volatile memory cells, and the failure address indicating the access address of the normal memory cell failing the testing in the normal cell array in each of the plurality of channels may be stored in the non-volatile memory cell array.

In the embodiment of the disclosure, the method for using the memory device may include: when the memory device is powered on, the failure address in the non-volatile memory cell array is transferred to a latch block of the corresponding channel.

In an exemplary embodiment, the latch block may include the first number of latches, the memory cell array may further include a spare cell array, the spare cell array may include the first number of spare memory cells, the spare memory cell may be a volatile memory cell, and each of the latches in the latch block in each channel may correspond to a respective one of the spare memory cells in the spare cell array in the corresponding channel.

When the memory device is powered on, the operation of transferring the failure address in the non-volatile memory cell array to a latch block of the corresponding channel may include: when the memory device is powered on, the failure address in the non-volatile memory cell array is transferred to the corresponding latch in the latch block of the corresponding channel so as to determine an access address of a target spare memory cell for replacing the failure address to be a repair address.

In an exemplary embodiment, the memory cell array may include a plurality of memory banks, the memory banks may share the spare cell array and the latch block, the spare cell array may include the first number of spare memory cells, each of the spare memory cells may be a volatile memory cell, the latch block may include the first number of latches, the non-volatile memory cell array may further include a scan host, both the latch block of each channel and the scan host may include a first interface, a second interface, and a third interface.

When the memory device is powered on, the operation of transferring the failure address in the non-volatile memory cell array to the latch block of the corresponding channel may include that: an enable signal is received through the first interface of the latch block of each channel and the scan host; a SC is received through the second interface of the latch block of each channel and the scan host; when the enable signal is at a first level, a channel address, a memory bank address and a latch block address are sequentially sent to the third interface of the latch block of each channel through the third interface of the scan host according to the SC, so as to respectively determine a target channel, a target memory bank of the target channel, and a target latch in the target latch block corresponding to the target channel, and sends a write command to the third interface of the latch block of each channel, so as to write the failure address to the target latch of the target latch block through the third interface of the target latch block of the target channel.

In an exemplary embodiment may further include a fourth interface.

When a read command is sent from the third interface of the scan host to the third interface of the latch block of each channel, data is read from the target latch through the fourth interface of the scan host; and the written failure address is compared with the read data to verify the written failure address.

According to the method for using the memory device provided by the implementation mode of the disclosure, the failure address which is tested in a testing phase and stored in the non-volatile memory cell array may be transferred to the corresponding latch of the corresponding channel, so that when the normal cell array of each channel is used, the fast read-write speed of the volatile memory cell in the normal cell array can be maintained, and the data read-write accuracy can be ensured.

From the above description of the implementation mode, those skilled in the art are easy to understand that the exemplary implementation mode described here may be implemented through software or may also be implemented through the software in combination with necessary hardware. Therefore, the technical solution according to the implementation mode of the disclosure may be embodied in the form of a software product. The software product may be stored in a non-volatile storage medium (which may be a CD-ROM, a U-disk, a mobile hard disk, and the like) or on a network, and may include a number of instructions, so that a computing apparatus (which may be a personal computer, a server, a touch terminal, or a network apparatus, and the like) executes the method according to the embodiment of the disclosure.

Further, the implementation mode of the disclosure further provides an electronic apparatus, including: one or more processors; and a storage device, configured to store one or more programs. The one or more programs, when executed by the one or more processors, cause the one or more processors to implement the method in any above embodiment.

Further, the implementation mode of the disclosure further provides a computer-readable storage medium having a computer program stored thereon. The program, when executed by a processor, implement the method in any above embodiment provided by the disclosure.

Other embodiments of the disclosure will be apparent to those skilled in the art from consideration of the specification and practice of the disclosure disclosed here. The present application is intended to cover any variations, uses, or adaptations of the disclosure, and the variations, uses, or adaptations follow the general principles of the disclosure and include common general knowledge or conventional technical means in the art undisclosed by the disclosure. The specification and embodiments are considered as examples only, and a true scope and spirit of the disclosure are indicated by the appended claims.

What is claimed is:

1. A memory device, comprising:
   a plurality of channels, each channel comprising a memory cell array, the memory cell array comprising a normal cell array, the normal cell array comprising normal memory cells, and each of the normal memory cells being a volatile memory cell;
   a testing control circuit, configured to control testing of the normal cell array in each of the plurality of channels in response to a testing instruction and to determine an access address of a normal memory cell failing the testing in the normal cell array in each of the plurality of channels to be a failure address; and
   a non-volatile memory cell array, configured to receive and store the failure address from the testing control circuit;
   wherein each of the channels further comprises a latch block, wherein the non-volatile memory cell array further comprises:
   a scan host, configured to, responsive to the memory device being powered on, transfer the failure address in the non-volatile memory cell array to the latch block of the channel corresponding to the failure address.

2. The memory device of claim 1, wherein the non-volatile memory cell array comprises an anti-fuse array.

3. The memory device of claim 1, wherein the non-volatile memory cell array comprises:

a control block, configured to control programming of the non-volatile memory cell array and store the failure address.

4. The memory device of claim 1, wherein the latch block comprises a first number of latches, the memory cell array further comprises a spare cell array, the spare cell array comprises the first number of spare memory cells, and each of the spare memory cells is a volatile memory cell, wherein
each of the latches in the latch block in each of the channels corresponds to a respective one of the spare memory cells in the spare cell array in the channel;
the scan host is configured to, responsive to the memory device being powered on, transfer the failure address in the non-volatile memory cell array to a latch in the latch block of the channel corresponding to the failure address, so as to determine an access address of a target spare memory cell for replacing the failure address to be a repair address.

5. The memory device of claim 4, wherein each of the channels further comprises:
a read-write circuit, configured to receive the testing instruction from the testing control circuit, to write first write data to a target normal memory cell in the memory cell array of the channel corresponding to the testing instruction in response to the testing instruction, to compare first read data read from the target normal memory cell with the first write data, and to output an indication signal indicating that the target normal memory cell passes or fails the testing based on a result of the comparison; and
a read-write control circuit, configured to control the read-write circuit, to take the access address of the target normal memory cell as the failure address responsive to the indication signal indicating that the target normal memory cell fails the testing, and to return the failure address to the testing control circuit.

6. The memory device of claim 5, wherein the read-write control circuit is further configured to control the read-write circuit to write second write data to be written to the target normal memory cell designated by the failure address to the target spare memory cell designated by the repair address.

7. The memory device of claim 4, wherein the normal cell array comprises a second number of normal memory cells, and the second number being greater than or equal to the first number.

8. The memory device of claim 1, wherein the memory cell array comprises a plurality of memory banks, the plurality of memory banks sharing a spare cell array and a latch block of the channel corresponding to the memory cell array, the spare cell array comprises a first number of spare memory cells, each of the spare memory cells being a volatile memory cell, the latch block comprises the first number of latches, and the non-volatile memory cell array further comprises a scan host, wherein,
both the latch block of each of the channels and the scan host comprise a first interface, a second interface and a third interface, wherein,
the first interface of the latch block of each of the channels and the scan host is configured to receive an enable signal;
the second interface of the latch block of each of the channels and the scan host is configured to receive a Signal of Clock (SC); and
the third interface of the scan host is configured to, responsive to the enable signal being at a first level, sequentially send, according to the SC, a channel address, a memory bank address and a latch block address to the third interface of the latch block of each of the channels, so as to respectively determine a target channel, a target memory bank of the target channel, and a target latch in the target latch block corresponding to the target channel, and to send a write command to the third interface of the latch block of each of the channels, so as to write the failure address to the target latch of the target latch block through the third interface of the target latch block of the target channel.

9. The memory device of claim 8, wherein both the latch block of each of the channels and the scan host further comprise a fourth interface, wherein
responsive to a read command being sent from the third interface of the scan host to the third interface of the latch block of each of the channels, data is read from the target latch through a fourth interface of the scan host, so as to compare the written failure address with the read data to verify the written failure address.

10. The memory device of claim 8, wherein each of the channels further comprises a read-write circuit and a read-write control circuit, the read-write control circuit is configured to control the read-write circuit to alternately read and write each of the memory banks in the memory cell array.

11. The memory device of claim 1, wherein the non-volatile memory cell array further comprises:
an analog block, configured to provide a power supply voltage for the non-volatile memory cell.

12. The memory device of claim 1, wherein the memory device comprises a plurality of memory layers which are vertically stacked, each of the memory layers comprising at least one channel.

13. The memory device of claim 12, wherein each of the memory layers comprises the plurality of channels, the testing control circuit, and the non-volatile memory cell array.

14. The memory device of claim 13, wherein each of the memory layers further comprises:
a charge pump, configured to provide power for at least one of: the plurality of channels, the testing control circuit, or the non-volatile memory cell array of the memory layer.

15. The memory device of claim 13, wherein each of the memory layers further comprises:
a temperature sensor, configured to test a temperature of at least one of: the plurality of channels of the memory layer, the testing control circuit of the memory layer, or the non-volatile memory cell array of the memory layer.

16. The memory device of claim 13, wherein each of the memory layers further comprises:
a chip identification memory device, configured to store information of chip identification of the memory layer.

17. A memory system comprising at least one memory layer each including the memory device of claim 1; wherein the memory system further comprises a memory controller configured to control the at least one memory layer.

18. A method for testing a memory device, wherein the memory device comprises a plurality of channels and a non-volatile memory cell array, each of the channels comprises a memory cell array and a latch block, the memory cell array comprises a normal cell array, the normal cell array comprises normal memory cells, each of the normal memory cell is a volatile memory cell, and the non-volatile memory cell array comprises a plurality of non-volatile memory cells, wherein the method comprises:
receiving a testing instruction;

controlling testing of the normal cell array in the plurality of channels according to the testing instruction and determining an access address of a normal memory cell failing the testing in the normal cell array in the plurality of channels to be a failure address; and sending and storing the failure address to the non-volatile memory cell array, wherein responsive to the memory device being powered on, the failure address in the non-volatile memory cell array is transferred to the latch block of the channel corresponding to the failure address.

19. A method for using a memory device, wherein the memory device comprises a plurality of channels and a non-volatile memory cell array, each of the channels comprises a memory cell array and a latch block, the memory cell array comprises a normal cell array, the normal cell array comprises normal memory cells, each of the normal memory cells is a volatile memory cell, the non-volatile memory cell array comprises a plurality of non-volatile memory cells, and the non-volatile memory cell array is configured to store a failure address indicating an access address of a normal memory cell failing the testing in the normal cell array in the plurality of channels, wherein the method comprises:

responsive to the memory device being powered on, transferring the failure address in the non-volatile memory cell array to the latch block of the channel corresponding to the failure address.

* * * * *